United States Patent
Augusto et al.

(10) Patent No.: US 7,068,206 B2
(45) Date of Patent: Jun. 27, 2006

(54) ASYNCHRONOUS SERIAL ANALOG-TO-DIGITAL CONVERTER METHODOLOGY HAVING DYNAMIC ADJUSTMENT OF THE BANDWIDTH

(75) Inventors: Carlos J. R. P. Augusto, San Jose, CA (US); Pedro N. C. Diniz, Cerritos, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 0 days.

(21) Appl. No.: 10/522,805

(22) PCT Filed: Jul. 31, 2003

(86) PCT No.: PCT/EP03/08642

§ 371 (c)(1),
(2), (4) Date: Aug. 19, 2005

(87) PCT Pub. No.: WO2004/013971

PCT Pub. Date: Feb. 12, 2004

(65) Prior Publication Data

US 2006/0049972 A1    Mar. 9, 2006

Related U.S. Application Data

(60) Provisional application No. 60/400,178, filed on Jul. 31, 2002.

(51) Int. Cl.
*H03M 1/12* (2006.01)
(52) U.S. Cl. .................................. 341/172; 341/120
(58) Field of Classification Search .............. 341/118, 341/120, 122, 155–172
See application file for complete search history.

(56) References Cited

U.S. PATENT DOCUMENTS

| | | | |
|---|---|---|---|
| 5,479,103 A | | 12/1995 | Kernahan et al. |
| 5,729,232 A | * | 3/1998 | Fujimori ............... 341/172 |
| 5,748,134 A | | 5/1998 | Dent |
| 5,841,310 A | * | 11/1998 | Kalthoff et al. ........... 327/337 |
| 6,124,819 A | * | 9/2000 | Zhou et al. .............. 341/155 |
| 6,340,945 B1 | * | 1/2002 | Hauptmann et al. ........ 341/172 |
| 6,366,231 B1 | | 4/2002 | Rao et al. |
| 6,448,911 B1 | * | 9/2002 | Somayajula ............. 341/120 |
| 6,839,011 B1 | * | 1/2005 | Hong .................... 341/143 |
| 6,963,300 B1 | * | 11/2005 | Lee ..................... 341/172 |
| 6,972,705 B1 | * | 12/2005 | Fei et al. ............... 341/143 |

FOREIGN PATENT DOCUMENTS

GB    2 319 127    5/1998

* cited by examiner

*Primary Examiner*—Rexford Barnie
*Assistant Examiner*—Linh V. Nguyen
(74) *Attorney, Agent, or Firm*—Young & Thompson

(57) ABSTRACT

A new methodology is disclosed to convert analog electric signals into digital data. The method provides a serial scheme without pre-definition of the number of bits (dynamic range). It allows digital processing of the input signal without sampling and holding of the input signal. Processing of the input signal is clock-less and asynchronously dependent on the time-evolution of the input signal itself. Thereby, a programmable, dynamic adjustment of bandwidth (product of dynamic range and speed of conversion) of the analog-to-digital conversion process can be achieved depending on the characteristics of the input signal. Dynamic adjustment of the bandwidth is accomplished by digitally controlling a "threshold" value at the input capacitor of the comparator, which when met by the input signal, triggers a transition at the output of the comparator.

6 Claims, 18 Drawing Sheets

ASYNCHRONOUS SERIAL ANALOG-TO-DIGITAL CONVERTER METHODOLOGY HAVING DYNAMIC ADJUSTMENT OF THE BANDWIDTH

BACKGROUND OF THE INVENTION

The present invention relates to the methods of converting analog electric signals into a stream of binary data, to be implemented with Integrated Circuit technology in general, and silicon Conplementary Metal Oxide Semiconductor (CMOS) circuits and technology in particular.

The fundamental problem of an analog-to-digital converter (ADC) is to determine for a given input voltage value "Vin" a corresponding digital binary value, "Bin". For example, an input voltage value of 1 volt might be encoded in binary as 00001000, and the value 1.25 volt might be encoded as the binary value 00001010. The process of assigning binary values to particular voltage values and voltage ranges is called quantization.

The conventional characterization of ADCs relies, mostly, on a few figures of merit, namely:

(a) The conversion rate: This metric, defined in number of samples per second (SPS), defines how fast can an individual conversion be performed;

(b) The resolution: This metric defines how many bits are used to characterize in the digital domain an input voltage value. It is defined as the number of quantization bits, or bit depth;

(c) The dynamic range: This metric defines the range of input voltage values that can be captured by the resolution of the ADC, and it is intimately connected with the maximum and minimum accepted input voltage levels, and the number of bits.

In terms of implementation of ADCs there are three basic methods, which are briefly described herein after. There are many schemes for conversion of analog signals to a binary digital representation. A conventional ADC uses a "Sample-and-Hold" (S&H) circuit to "capture" an "instataneous" value of the input signal. The "captured" value is the input voltage to be converted. The time interval until the next sample is captured, defines the conversion rate. The S&H circuit usually consists of a capacitor and a circuit to hold steady the electrical signal being digitized by the ADC circuitry.

ADC conversion methods can be divided into three main classes, namely direct methods, feedback methods and integrating methods. These methods have distinct power consumption, accuracy and sampling rate metrics.

In the direct methods, the ADC circuitry directly uses the input signal and compares it against a set of predefined reference voltage levels. For example, in a parallel or flash ADC implementation with a quantization of N-bits, the input voltage is compared against a set of $2^N-1$ comparators. The output of each comparator directly defines a digital value for the input signal for a specific bit position. This is an extremely fast method but with increasingly prohibitive costs for larger numbers of conversion bits as for N bits, the implementation must have an electrical mesh with $2^N$ resistors and $2^N-1$ comparators. This method is also very prone to noise problems.

Also in this category are the sub-ranging ADCs, sometimes also called "pipelined ADC architectures". In the sub-ranging scheme, N conversion ADCs with B bits of resolution are cascaded to attain N×B bits of resolution. The idea is that each of the ADC successively refines the conversion; the first ADC converts the higher order B most significant bits; the next ADC the next B bits and so forth. At each stage the input signal is subtracted with the analog values corresponding to the bits resolved at that point in the cascade, so that the next set of B bits can be converted. This scheme requires equal numbers of ADCs and digital-to-analog conversion circuits along with analog signal subtractor circuits. A potential drawback is the need for analog subtraction, which is prone to noise problems. Although quite high throughput can be attained, the latency of conversion, i.e., the time taken for a single conversion to be completed, is relatively low.

In the feedback methods, the binary representation for the signal is attained indirectly by comparing a running reference signal against the input signal. When the two signals match, the conversion stops, and the corresponding binary representation for the running reference signal is reported. Examples of this class of conversion schemes include the "single-slope" and "dual-slope" methods.

One version of this counter-based approach is the tracking or "Successive Approximation" Conversion. This method, rather than attempting to generate a full binary representation of the input voltage at once, relies on a sequence of steps to derive the full binary value. A register is connected to a Digital-to-Analog Converter (DAC) that is connected to a comparator that checks the output of the DAC against the input signal. First, the method determines the higher-order bit or bits, followed by the determination of the lower-order bits, until the fill binary value has been determined The conversion is done by successively setting the most significant outstanding untested bits of the register. A given bit of the register is set to 0 if the output of the DAC for that setting surpasses the input signal as noticed by the comparators output. If not the bit of the register is set to 0 and the conversion advances to the next bit of the register.

There are numerous implementations of the successive approximation method. Some rely on a comparison of voltages, either the input voltage or a reference voltage generated by a DAC. The comparisons proceed using a binary search strategy until all bits are resolved. Another commonly used approach, as popularized by the Delta-Sigma method, consists of using a digital up/down counter in which the value of the counter is either incremented or decremented, based on the voltage difference between the input signal and the analog conversion of the value of the digital counter by an auxiliary DAC. Overall, this method of tracking the input signal trades-off speed of tracking for precision of conversion, since the counter cannot keep up with very fast changing signals.

Another version is the "Voltage-to-Time" or "Voltage-to-Frequency" conversion approach. With this method, the input binary digital value corresponding to the input analog voltage is determined by the value of a digital counter. In the voltage-to-time conversion approach, the counter is allowed to count from 0 up to the time when the analog value, i.e., the result of the digital-to-analog conversion of the counter value, exceeds the input analog voltage. In the Voltage-to-Frequency conversion the counter is provided with a train of digital pulses whose number per unit of time (i.e., frequency) is proportional to the value of the input voltage. The number of pulses generated for a defined time interval, determines the binary digital value corresponding to the input analog voltage. The counter conversion method consists of a single analog comparator. At one input of the counter we have the input signal. The other input is connected to an analog signal generated by a DAC circuit that in turn is connected to a binary digital counter. The counter is left running until the output of the DAC equals or surpasses the input signal. When this happens the comparator's output becomes active stopping the binary counter and therefore the conversion. Of all the methods mentioned above, this is the slowest but also the most precise, making it very attractive when raw speed is not an issue. In integrating methods, the quantitation is accomplished by converting the input signal amplitude into a time interval to be measured subsequently. The single slope method, is the simplest of the methods in this class, and consists of loading a capacitor with the input signal voltage and using a counter that is stopped when the capacitor voltage reaches a predefined reference value. The dual-slope conversion method is a version of this method with better insensitivity to variation of the parameters relevant to capacitor design. While these methods are highly linear and are good at rejecting input noise, they are quite slow. Another scheme is the first order Delta-Sigma. This scheme consists of a Delta-Sigma modulator, a digital filter, and a decimator and relies on the spectral effects of over-sampling to provide improvements of the signal-noise-ratio (SNR) of the overall conversion.

Several refinements of these methods exist For example, current state-of-the art pipelined conversion implementations use a variant of the successive approximation methods, that allows each of a many conversion stages to focus solely on converting a portion of the input voltage (rather than the full amplitude), thereby increasing the throughput of the conversion at the price of higher overall conversion latency. As for the Delta-Sigma methods, other variants use multiple bits rather than a single increasing/decreasing bit as mentioned above.

In terms of traditional applications, "Flash ADCs" are used for applications when raw speed is of paramount importance, such as for the acquisition of short bursts or fast changing signals, i.e., high-frequency signals. "Voltage-to-Frequency" methods are used when precision is more important than speed.

Depending on the application, some methods are preferable to others. For example, in image-sensors for digital photography, if the A-to-D conversion had to be done serially for all pixels in the image-sensor, then either precision or pixel count would have to be traded-off. However, 2D arrays of pixels are highly suitable for massive parallelization, in which each column can have its own ADC. A further step in parallelization is to have "in-pixel ADC", provided the circuit area for the ADC is reasonable compared to the total area for the pixel. This is the type of application in which "Voltage-to-Frequency" methods have been favored, partly due to their precision, and partly due to their low transistor count. In the field of image-sensors, the conventional faster methods of A-to-D conversion are inadequate due to their high implementation cost in terms of the overall number of transistors.

Overall conventional schemes rely on the fact that the input signal, a voltage, has to be held constant for a short period of time. To this effect, conventional architectures have a sample-and-hold (S&H) circuit. The S&H circuit consists essentially of a capacitor to charge up and hold the input voltage for as long as it takes to convert this voltage to a binary digital representation. In addition, the implementation defines the conversion rate in a rather rigid fashion (hardwiring), with the latter being dependent on the time the S&H circuit holds the input voltage value. The holding interval is the time of conversion, and defines a time base for the remainder of the operations in the ADC.

Another fundamental aspect of the current architectures is that, the number of bits dedicated to the conversion, is also predefined in a rigid fashion. For example in the Parallel or Flash ADC, the number of steps in the ladder defines the number of bits. In the successive approximation approach, the DAC also needs to have a predefined number of bits. In conventional implementations of Voltage-to-Frequency conversion methods, the digital counters have also a predefined number of bits.

Once defined, these two fundamental parameters, sampling/conversion time and number of bits, constrain the current designs and do not allow for a flexible digitally programmable ADC. Therefore it is not possible to manage the available bandwidth of the ADC, to adapt it to changing characteristics of the input signal and/or requirements for the conversion. The ADC architecture described this document is very flexible. It combines the precision of a voltage-to-frequency conversion for very small differential signals, with an extrapolation scheme for large amplitude input signals.

With respect to the fabrication technologies employed to manufacture integrated circuits, and especially CMOS technology, it is well known that historically the main driving forces behind "Moore's Law" have been the purely digital circuits, such logic and memory. The incorporation of analog circuit elements into an IC requires a more stringent control of the fabrication processes in order to reduce leakage currents and the variability of the electrical parameters of the analog components. Depending on the application, it may even be necessary to include more active elements, such as bipolar transistors, in which case extra process steps need to be added to the fabrication flow. In addition, some of the extra process steps interact with others, leading to an extensive and expensive fine-tuning of the entire fabrication process. It is then not surprising that the leading edge Analog CMOS process technology usually lags one or two generations behind the leading edge Digital CMOS process technology available from the same vendor (silicon foundry). Furthermore, the laws of CMOS scaling dictate the operating voltage to roughly scale in the same proportion to the physical dimensions of the MOSFETs (this is called "constant electric field scaling"). This presents a serious problem to analog circuit design because the scaling of noise level does not follow the scaling of the operating voltage, and therefore die signal to noise ratio is reduced. It is very questionable if analog circuit design can be practical for operating voltages of 1 volt and below.

It is therefore highly desirable to have ADC designs, which do not require analog circuit elements, such as adders and subtractors, and hence could be fabricated with the leading edge Digital CMOS process technologies. There are many advantages in using a CMOS process technology which is two generations more advanced, including the critical issue of making unnecessary the fabrication of bipolar transistors, due to the much better high-frequency performance of the more advanced (smaller) MOSFETs. Other advantages include, more sophisticated digital circuitry, which may enable the co-integration of functionalities that would otherwise require extra ICs; the possibility of operation at a lower voltage with the consequent lowering of power dissipation, with beneficial impact on the heat removal and battery lifetime; smaller transistors also mean more ICs per wafer and thus lower production costs; etc.

OBJECT OF THE INVENTION

A first object of the present invention is a new analog-to-digital conversion methodology that can be implemented with circuit elements allowing digital processing of the input signals.

A second object of the invention is a new analog-to-digital conversion methodology that allows digital processing of the input signals without pre-definition of the number of bits.

Another object of the invention is a new analog-to-digital conversion methodology that allows digital processing of the input signal without sampling and holding of the input signal.

Yet another object of the invention is a new analog-to-digital conversion methodology in which digital processing of the input signal is clock-less, and asynchronously dependent on the time-evolution of the input signal itself.

Another object of the invention is a new analog-to-digital conversion methodology that allows a dynamic, digital programmable, management of the bandwidth, trading dynamic range for conversion speed, as a function of the characteristics of the input signal.

SUMMARY OF THE INVENTION

The method of the invention provides a serial scheme without pre-definition of the number of bits (dynamic range). This method does not sample & hold the input signal, it is clock-less and asynchronously dependent on the time-evolution of the input signal itself. Thereby, a programmable, dynamic adjustment of bandwidth (product of dynamic range and speed of conversion) of the analog-to-digital conversion process can be achieved depending on the characteristics of the input signal. Dynamic adjustment of the bandwidth is accomplished by digitally controlling a "threshold" value at the input capacitor of the comparator, which when met by the input signal, triggers a transition at the output of the comparator.

A Digital Control unit monitors the output of the comparator, and once a transition is detected, a command is issued to reset the input capacitor of the same comparator. Thus, the resetting of the input capacitor is asynchronously linked to the occurrence of transitions at the output of the comparator, which take place only if the input signal exceeds the threshold value that the input capacitor was pre-charged with. Therefore, for as long as the input signal remains below the threshold value, there will be no transitions at the output of the comparator, and no resetting of the input capacitor. The input capacitor is continuously exposed to the input signal, thus making possible to have a constant monitoring of the input signal with minimal circuit activity and hence minimal power dissipation.

This methodology can be applied to voltage signals and charge signals stored in reservoirs. The present disclosure presents multiple exemplary implementations of the methodology of the present invention, suitable for voltage and charge input signals.

The analog-to-digital conversion methodology of the present invention, applied to charge signals can be implemented with a "charge-to-frequency" scheme in which very small, well defined, "packets of charge" are subtracted from a "Charge Reservoir". The process stops when the residual charge in the "Charge Reservoir" is smaller than a "packet of charge". The quantization of the charge in the reservoir is accomplished through the counting of how many "packets of charge" were subtracted from the "Charge Reservoir" until it became empty, that is, until its residual charge became smaller than one "packet of charge".

The analog-to-digital conversion methodology of the present invention, applied to voltage signals can be implemented with a "voltage-to-time" scheme, in which the input signal is extrapolated from the transient across a small capacitor. The time taken by transient voltage across the capacitor to reach a known, well defined, reference voltage is used to extrapolate, what the input voltage is. The knowledge of the reference voltage, of the time constant of the capacitor, of the time taken by the transient to reach the reference voltage, enables the calculation of the input voltage, through analytical formulas.

DESCRIPTION OF THE INVENTION

Analog-to-Digital Conversion Methodology for Charge Signals.

When applied to charge signals, the method of the present invention quantizes the amount of charge present in a "charge reservoir" by subtracting a pre-defined small amount (a "packet") of charge from said reservoir. For as long as the amount of charge in the reservoir is larger than a "packet of charge", one more "packet of charge" can be subtracted from the reservoir. The quantization process consists in counting the total amount of packets that are removed from the reservoir.

Even though the amount of charge in the "reservoir" is an analog quantity, because the "packet of charge" is a known, precisely defined quantity, the charge-subtraction is itself a "digital process". In other words, the conversion process works by subtracting a small "digital amount" of charge from an analog charge reservoir.

A packet of charge is defined through the pre-charging of the input capacitor (Cref) of the comparator. The voltage with which the pre-charging is done, defines the exact size of the "packet of charge".

Figure 1:
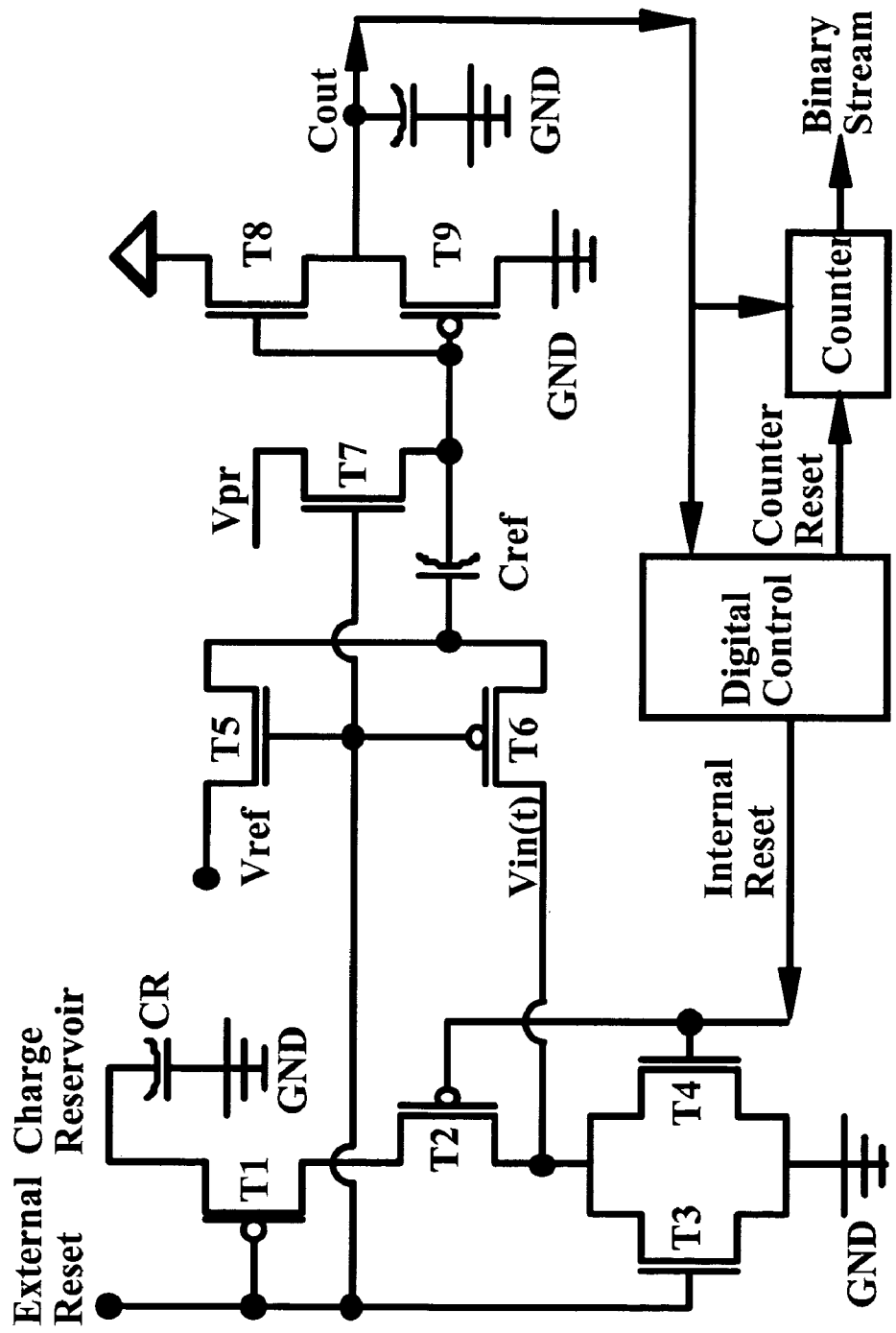
FIG. 1 shows a first exemplary implementation of the method of the present invention for charge signals.
Figure 2:
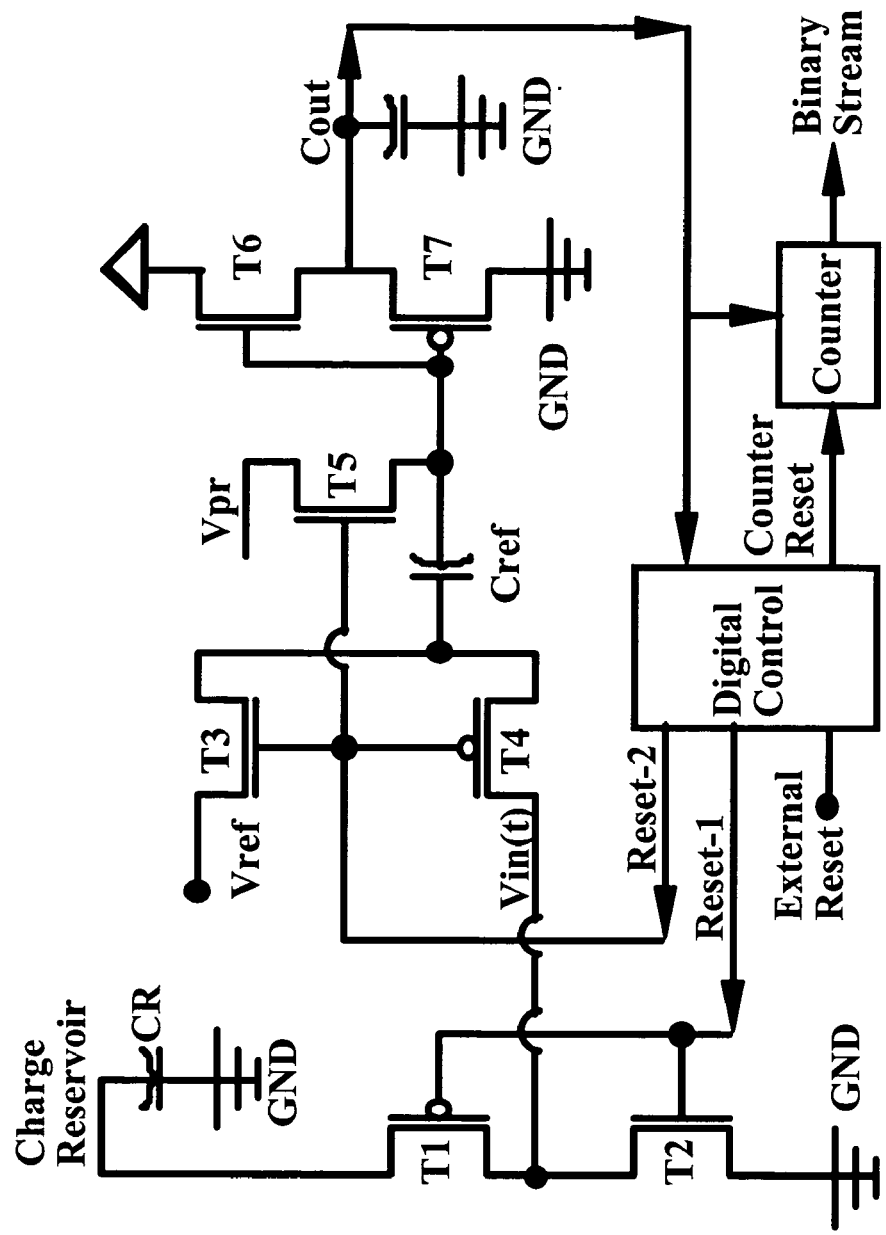
FIG. 2 shows a second exemplary implementation of the method of the present invention for charge signals.

FIGS. 1 and 2 show exemplary circuits illustrating the operating principle of the charge-to-frequency conversion. Both figures show a "Charge Reservoir" that is represented by Capacitor CR, which can be implemented in CMOS technology by a Metal-Oxide-Semiconductor (MOS) capacitor or through a pn-junction capacitor.

In the implementation of FIG. 1, an external reset signal is incorporated into the path between the "Charge Reservoir" CR and the comparator.

Initialization Procedure

An initialization procedure is triggered by an external reset. The "Charge Reservoir" (CR) is disconnected from the comparator: T1 is OFF, T3 is ON.

Pre-charging of the input capacitor Cref: T2 is OFF, T4 is ON, T5 is ON, T6 is OFF, T7 is ON.

Quantization Procedure

Absence of external reset: the "Charge Reservoir" (CR) is connected to the comparator. T1 is ON, T3 is OFF.

The ADC is in standby mode: T2 is ON, T4 is OFF, T5 is OFF, T6 is ON, T7 is OFF.

Figure 3:
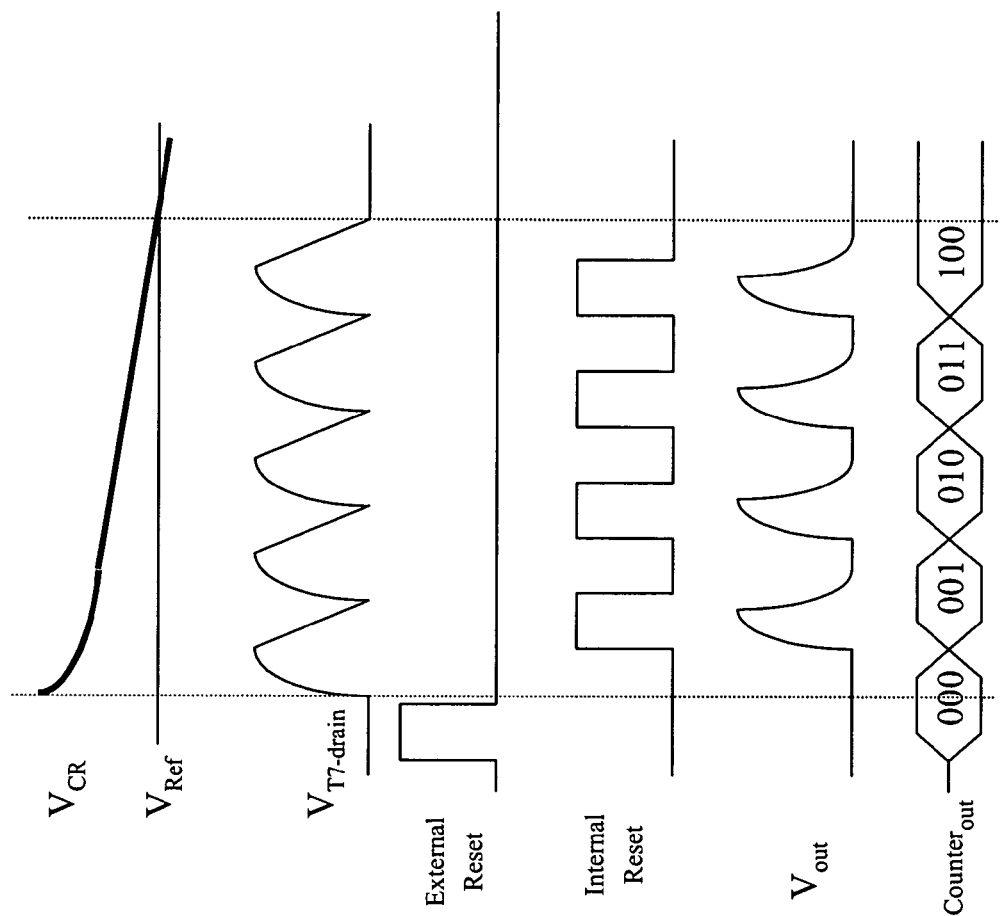
FIG. 3 shows the timing diagram illustrating the mode of operation of the circuits shown in FIGS. 1 and 2.

The timing diagrams illustrating the mode of operation of this implementation are shown in FIG. 3.

If the amount of charge in the "Charge Reservoir" (CR) is larger than the charge that Cref was pre-charged with, then a packet of charge Qref=Cref×Vref is removed from the reservoir CR. The initial condition (t=0) at the "Charge Reservoir" (CR) was:

$$Vcr(t=0)=Qcr(t=0)/Ccr$$

After the subtraction of one packet of charge Qref (t=1), one has:

$$Vcr(t=1)=[Qcr(t=0)-Qref]/Ccr$$

Figure 4:
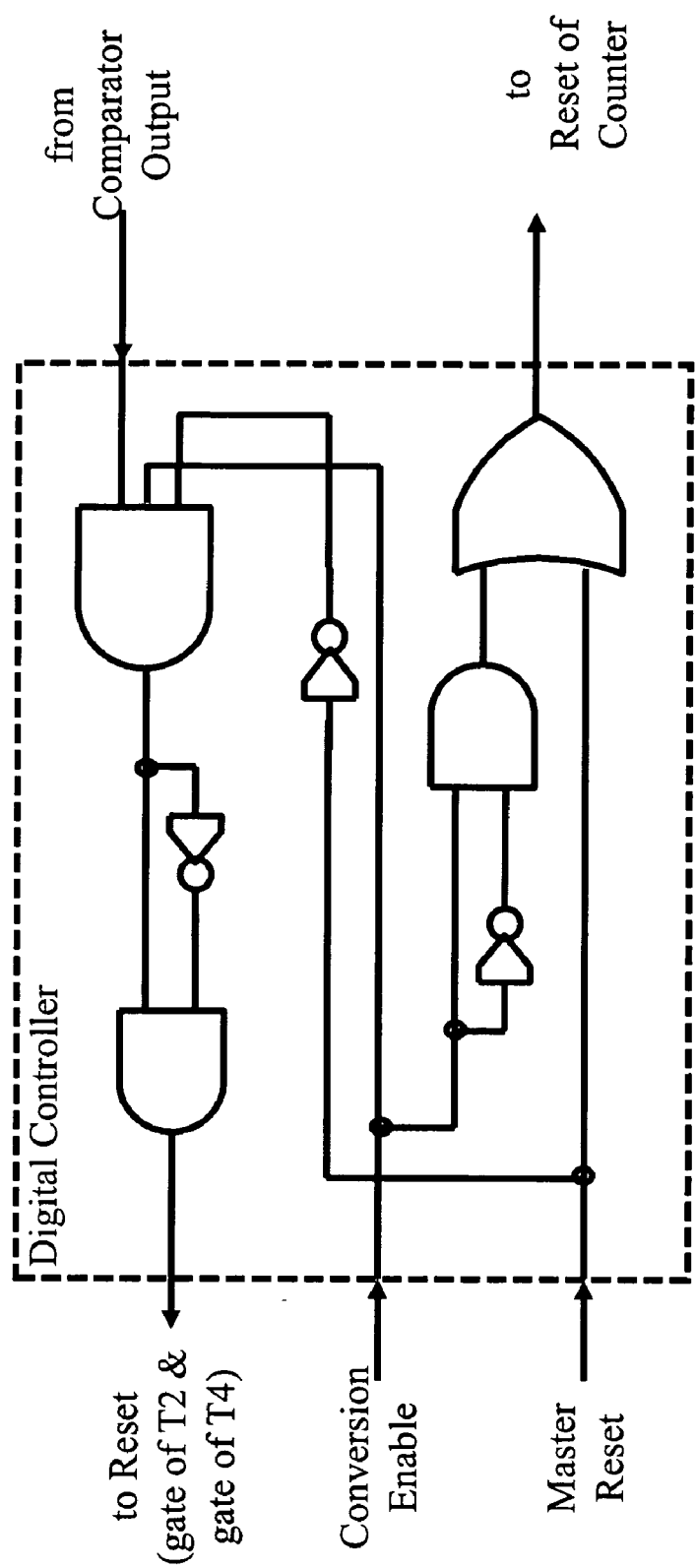
FIG. 4 shows one exemplary implementation of the "Digital Control" block shown in the implementations of FIGS. 1 and 2.

At that moment and simultaneously, a transition takes place at the output of the comparator, which in turn triggers an internal resetting of the input capacitor Cref. The internal resetting consists in "disconnecting" T6 from the charge reservoir, and discharging Cref. That is done through the Digital Control block switching T2 OFF and turning T4 ON for a period of time that is related to the time constant of the capacitor Cref, which can be found through a simple test procedure. As soon as the time interval necessary to discharge Cref is over, the Digital Control block turns T2 ON and T4 OFF, thereby exposing Cref to the charge in the reservoir CR At any given moment that the comparator is in a standby mode, and the amount of charge in the reservoir CR is smaller than Qref, the comparator remains in standby mode until the moment that the amount of charge in the reservoir CR is increased above Qref. The pre-charging of the input capacitor Cref in the comparator with Qref=Cref×Vref, sets the size of the packet of charge. Each time a packet of charge is removed from the reservoir, a transition takes place at the output of a comparator, which is monitored by the "Digital Control" block, an exemplary implementation of which is shown in FIG. 4.

When the Digital Control detects a transition, at the output of the comparator, it sends a command to reset the input of the comparator, which in turn leads to another transition (in opposition to the first one). These two transitions form a pulse, whose width is related to the time delay associated with Digital Control and with the discharging of the input capacitor (Cref) of the comparator. The resetting of the capacitor at the input of the comparator makes it immediately available to be charged up again, and thus for another packet of charge to be counted.

For a number of subtractions N, the voltage at the "Charge Reservoir" CR is:

$$Vcr(t=N)=[Qcr(t=0)-N\times Qref]/Ccr$$

The number of pulses equals the number of packets of charge removed from the charge reservoir, thus resulting in a "charge-to-frequency" conversion. The pulses are be used to increment a Gray-code counter, shown in the drawings as the "Counter" block, which was chosen to minimize the number of transitions and therefore the energy dissipation. The counter allows an external circuit to readout the value as the content of a static memory device.

The resetting of the capacitor only happens if the output of the comparator changes state, which in turn depends on the input signal. The serial nature of the scheme together with the ability to change the size of the "packets of charge", by changing the voltage with which the input capacitor of the comparator is pre-charged, enables a programmable dynamic range, i.e., number of quantization bits, and consequently the speed of conversion: smaller packets of charge enable a larger number of bits, but will increase the number packets of charge to be subtracted from the charge reservoir, resulting in longer times to completely discharge the charge reservoir.

The charge reservoir can be an open system in which more charges can be added at any time, even while the quantization through the charge-subtraction process is taking place. Therefore "sampling & holding" of the input signal does not occur. Charge-counting through charge-subtraction never stops for as long as the charge in the reservoir exceeds the magnitude of the "digital" packet of charge. If the charge in the reservoir is less than the charge in the reference capacitor of the comparator, then the comparator is in an "idle" mode, standing-by until the moment that more charge might be added to the reservoir. Under the assumption that any practical "charge reservoir" (capacitor) has a maximum capacity, the charge-subtraction process should be much faster than the rate of addition of more charges into the reservoir, so that its full capacity is never reached.

Since this approach does not rely on a synchronous clock signal, but rather, uses an internal "asynchronous feedback" path to generate a digital train of pulses, the proposed approach can achieve very low quiescent power consumption. Therefore, it can be viewed as a "serial asynchronous conversion scheme", in which no assumptions are made beforehand about the dynamic range of the input signal.

The proposed scheme is essentially free of analog components with the design and tunability advantages mentioned earlier. The capacitor Cref is used to discriminate if the charges being accumulated are below or above a certain threshold, not to store a particular exact value of charge. In this sense there is great similarity with the capacitors used in digital memories, such as Dynamic Random Access Memory (DRAM). In these circuits/applications the charge stored at capacitors is read by sensing if it is above or below at certain reference value. It is therefore perfectly justified to say that the Reference Capacitor (Cref), and hence this analog-to-digital conversion scheme, does not require analog components.

In the implementation of FIG. 2, a global external reset signal is routed through the "Digital Control" block.

Initialization Procedure

An initialization procedure is triggered by an external reset. The "Charge Reservoir" CR is disconnected from the comparator: T1 is OFF, T2 is ON.

Pre-charging of the input capacitor Cref: T3 is ON, T4 is OFF, T5 is ON.

Quantization Procedure

The "Charge Reservoir" CR is connected to the comparator: T1 is ON, T2 is OFF.

The ADC is in standby mode: T3 is OFF, T4 is ON, T5 is OFF.

The timing diagrams illustrating the mode of operation of this second implementation are shown in FIG. 3.

An exemplary application of the analog-to-digital conversion methodology of this invention for charge signals, is for Image Sensors, and in particular CMOS image sensors. The intrinsic nature of light sensing is the type of signal that produces finite amounts of charge, proportional to the number of photons or light intensity impinging on the photodiodes. The time during which light is absorbed it usually called the "shutter time". During this time, a finite number of charges is collected and stored in a "charge reservoir" until the moment of readout and/or quantization.

Other applications include optoelectronic transceivers used to convert fiber optics telecommunications signals from the optical to the electronic domains. This section details how the ADCs of the present invention can be applied to CMOS image sensors.

Typically, the photo-detector elements in the CMOS sensor matrix are pn-junction photodiodes. These photodiodes, because they are not operated in the Geiger mode, produce an analog signal in which the signal amplitude is linearly proportional to the number of absorbed photons. In the "photovoltaic mode" each photon produces one electron-hole pair. In the avalanche mode, there is a gain mechanism—multiplication by impact ionization—through which one photon may generate hundreds or thousands of electron-hole pairs.

Analog-to-digital conversion can be incorporated into CMOS image sensors through different architectural options. The ADC of the present invention can be used with any of these different architectural options:

One ADC converts the analog signals from all pixels of the sensor matrix,
One ADC per column of the sensor matrix,
One ADC inside each pixel.

At the present, the most common type of CMOS Imagers are Active-Pixel Sensors, in which the circuitry inside each pixel converts the charge signal to a voltage signal which is then converted into a digital signal.

Figure 5:
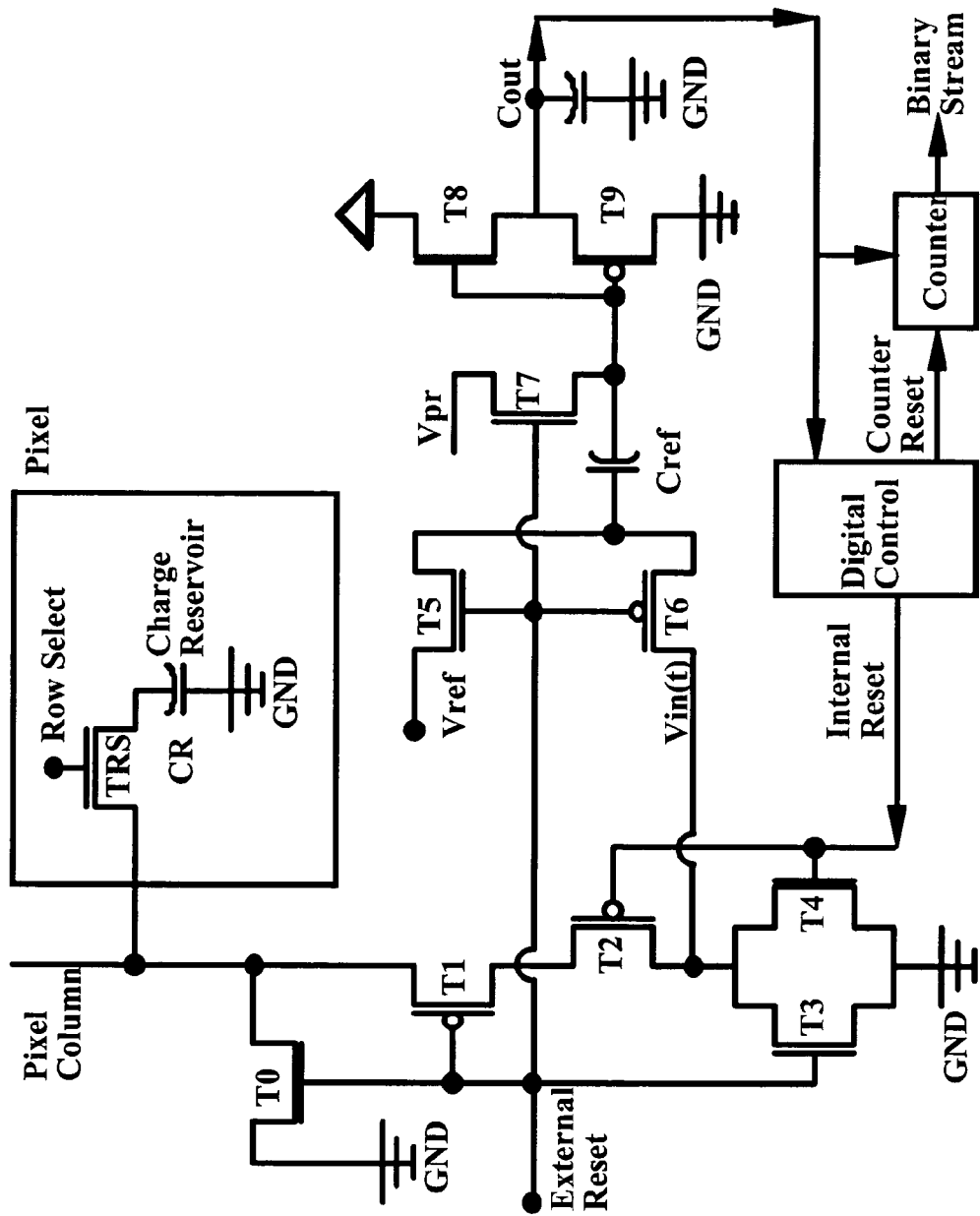
FIG. 5 shows the ADC of FIG. 1, applied to CMOS image sensors, in an arrangement suitable for "one ADC per column of the sensor matrix".
Figure 6:
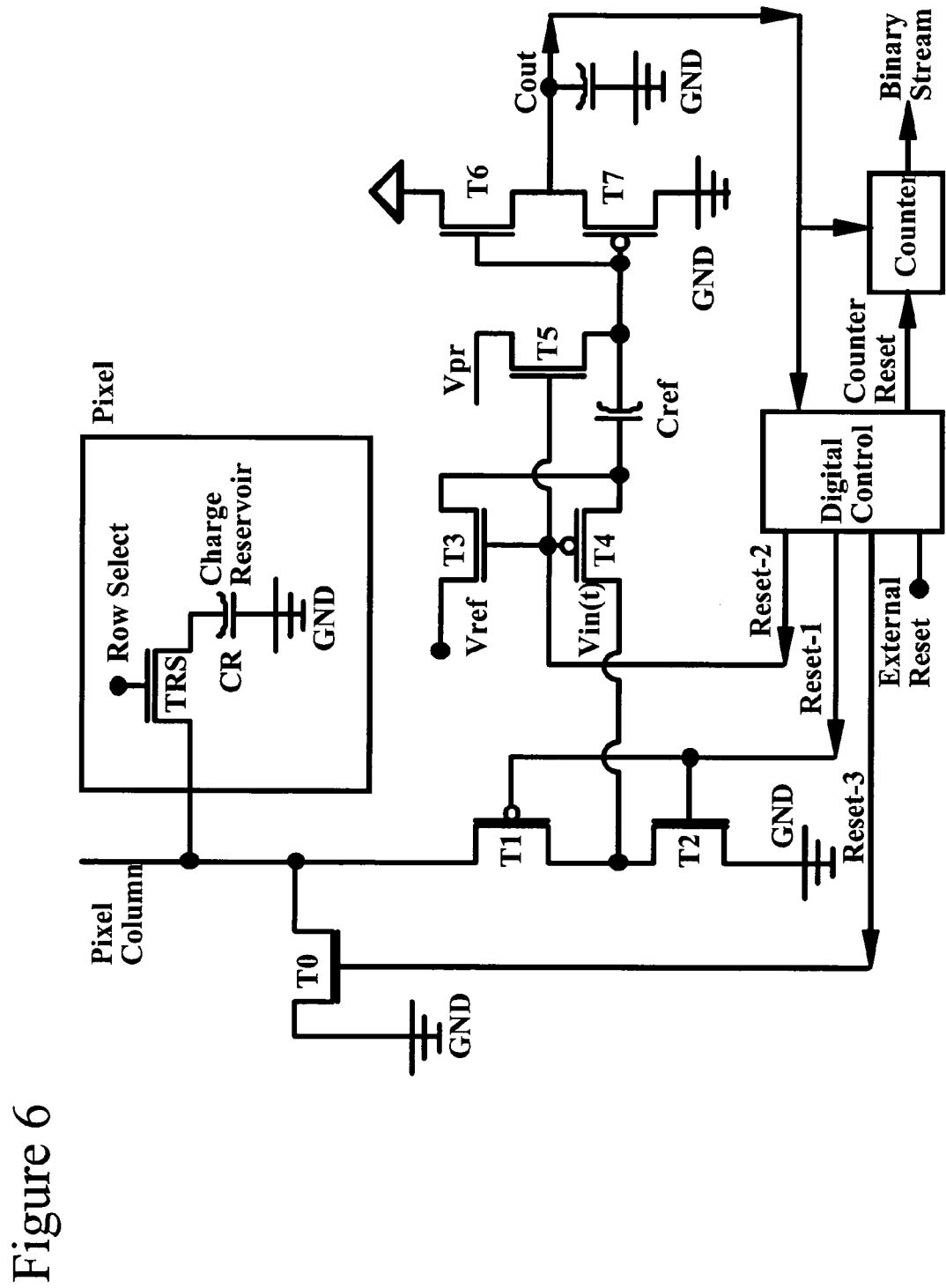
FIG. 6 shows the ADC of FIG. 2, applied to CMOS image sensors, in an arrangement suitable for "one ADC per column of the sensor matrix".

Arrangements suitable for "one ADC per column of the sensor matrix" are shown in FIGS. 5 and 6. These arrangements include the same ADCs as the circuits of FIG. 1 and FIG. 2, respectively, with two extra transistors Tr and T0. The charge reservoirs are not adjacent to the ADC and are in fact multiplexed over the column metal line. The pixel region does not show the photodiode, nor the circuitry—if any—controlling the photodiode.

The extra transistors Tr are turned ON and OFF by the Row-Select signal. All the pixels in a metal column are read sequentially over the same metal line. The Row-Select signal selects which pixel has access to the metal line. The extra transistor T0 is a transistor meant to discharge the metal line use for pixel readout. T0 is activated when there is an initialization procedure or an External Reset command.

Analog-to-Digital Conversion Methodology for Voltage Signals.

The conversion through extrapolation uses a single slope method to obtain a digital representation of the time interval taken by the time-transient voltage V(t) across the capacitor Cref to reach the value Vref.

Working with the transient signal across a capacitor is a scheme that, by definition, does not require a traditional Sample & Hold (S&H) circuit, thus avoiding problems such as aperture jitter. In addition, the extrapolation conversion scheme is also free from the constraint of a predetermined dynamic range specification, which is typically imposed by the expected voltage swing at the S&H circuitry.

Furthermore, this extrapolation method does not rely on any externally provided synchronization signal. A clock signal is used not to dictate a time base, but only to count the time it takes for the input signal to reach the value of Vref. The minimum time interval taken to perform the conversion, that is, the time interval Tref for the time-transient voltage V(t) across the capacitor Cref to reach the voltage value Vref, must always be longer than the period of the oscillation of the clock Tclock.

The concept of the extrapolation method is based on the analytical modeling of the transient voltage across a charging capacitor Cref for a constant input voltage Vin.

In reality, the input signal is not constant but time-evolving Vin(t). However, if the time interval required for the conversion through extrapolation is much smaller than the time interval needed for the input signal to change appreciably, then the input signal can be taken to be constant in comparison to the transient. Under this condition, the extrapolation scheme being described here is perfectly valid. Should the assumption be violated, that is, should the input signal Vin(t) change in time intervals comparable or even shorter than the time. Interval required for the conversion, then there would be a time-averaging effect, having some similarity to the effect of "sampling and holding" the input signal. In other words, the extrapolation scheme becomes less accurate for the components the input signal Vin(t) having frequencies close to the maximum conversion frequency.

The extrapolation method has two aspects. The first is the measurement of the time interval that it takes for the input signal to reach a known voltage level. The second is the use of a series of analytical formulas to derive the digital value of what the final voltage across the capacitor should be.

The formulas below illustrate how the extrapolation scheme can derive the absolute magnitude of the analog input signal. The voltage across the capacitor Cref with the residual charging resistance of R is given by the analytical expression (1) below, where "Exp" denotes the natural exponential function. In the formulas below, the time-variable input signal Vin(t) will be represented just as Vin, because it is assumed to be constant during the transient and conversion.

$$V(t) = Vin \times \{1 - Exp[-t/(R \times Cref)]\} \quad (1)$$

For a given constant reference voltage Vref, such that 0<Vref<Vin, it is possible to define the time Tref it takes for the voltage V(t) to reach Vref.

$$Vref = V(t = Tref) = Vin \times \{1 - Exp[-Tref/(R \times Cref)]\} \quad (2)$$

which can be rearranged as:

$$1 - (Vref/Vin) = Exp[-Tref/(R \times Cref)] \quad (3)$$

After some simple algebraic manipulations, one arrives at the analytical expression (4) for Tref, where "Ln" stands for the natural logarithm function.

$$Tref = R \times Cref \times Ln[Vin/(Vin - Vref)] \quad (4)$$

The digital value of Vref is known, because it is the content of a register corresponding to a specified known voltage. The time constant R×Cref of capacitor Cref can be found through a simple test and calibration procedure.

Knowing R×Cref and Vref, it is possible to express Vin as a transcendental function of R×Cref, Vref, and Tref, as shown in equation:

$$Vin = Vref/\{1 - Exp[-Tref/(R \times Cref)]\} \quad (5)$$

This means that having digital values for Vref and R×Cref, makes possible to evaluate the expression Vref/{1−Exp[−Tref/(R×Cref)]} for any Tref, and obtain the digital value for Vin.

The analog-to-digital conversion methodology as described above can be implemented in different ways. The following two are given for exemplary purposes.

Figure 7:
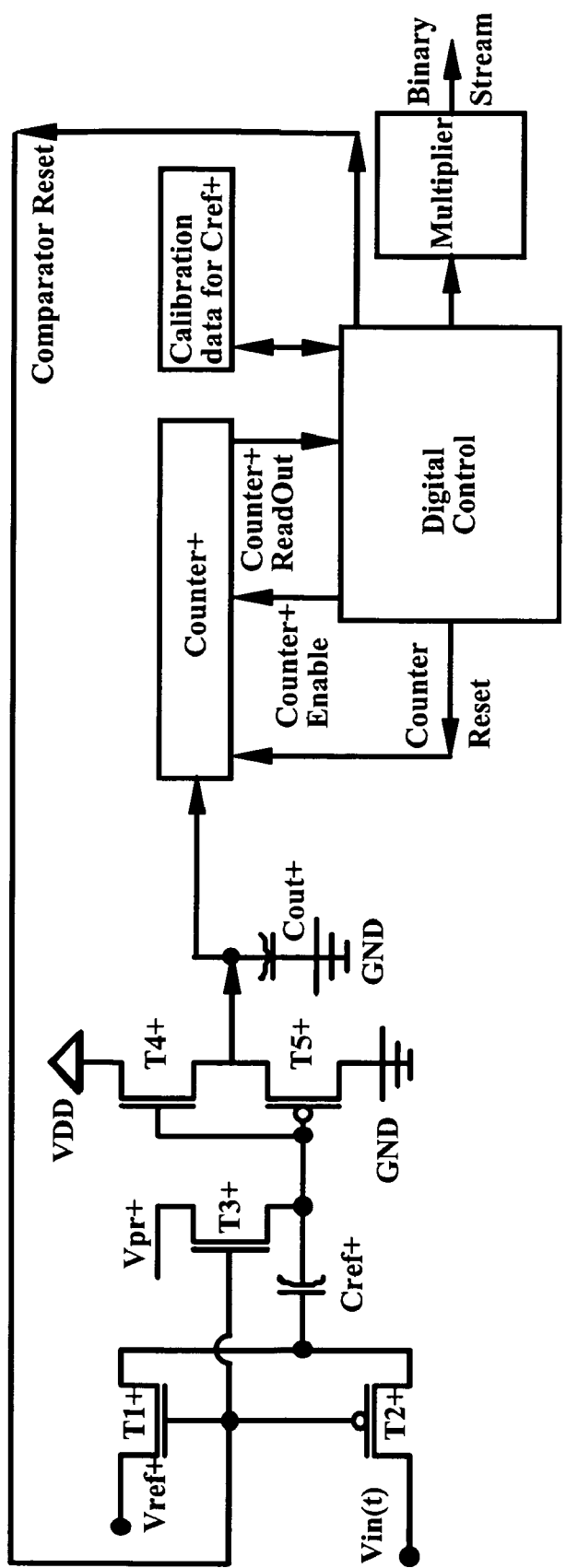
FIG. 7 is a circuit diagram exemplifying a first possible implementation of the present invention for handling input signals of positive polarity only.

FIG. 7 shows a circuit diagram exemplifying a first possible implementation of the present invention for handling input voltage signals of positive polarity only. This implementation includes a hardware multiplier. With this implementation, once the clock stops, the digital value for the time Tref is plugged in into the formula Vref/{1−Exp[−Tref/(R×Cref)]}. The formula is evaluated in a time interval compatible with the desired conversion speed. The highest possible conversion speed requires a hardware multiplier.

Figure 8:
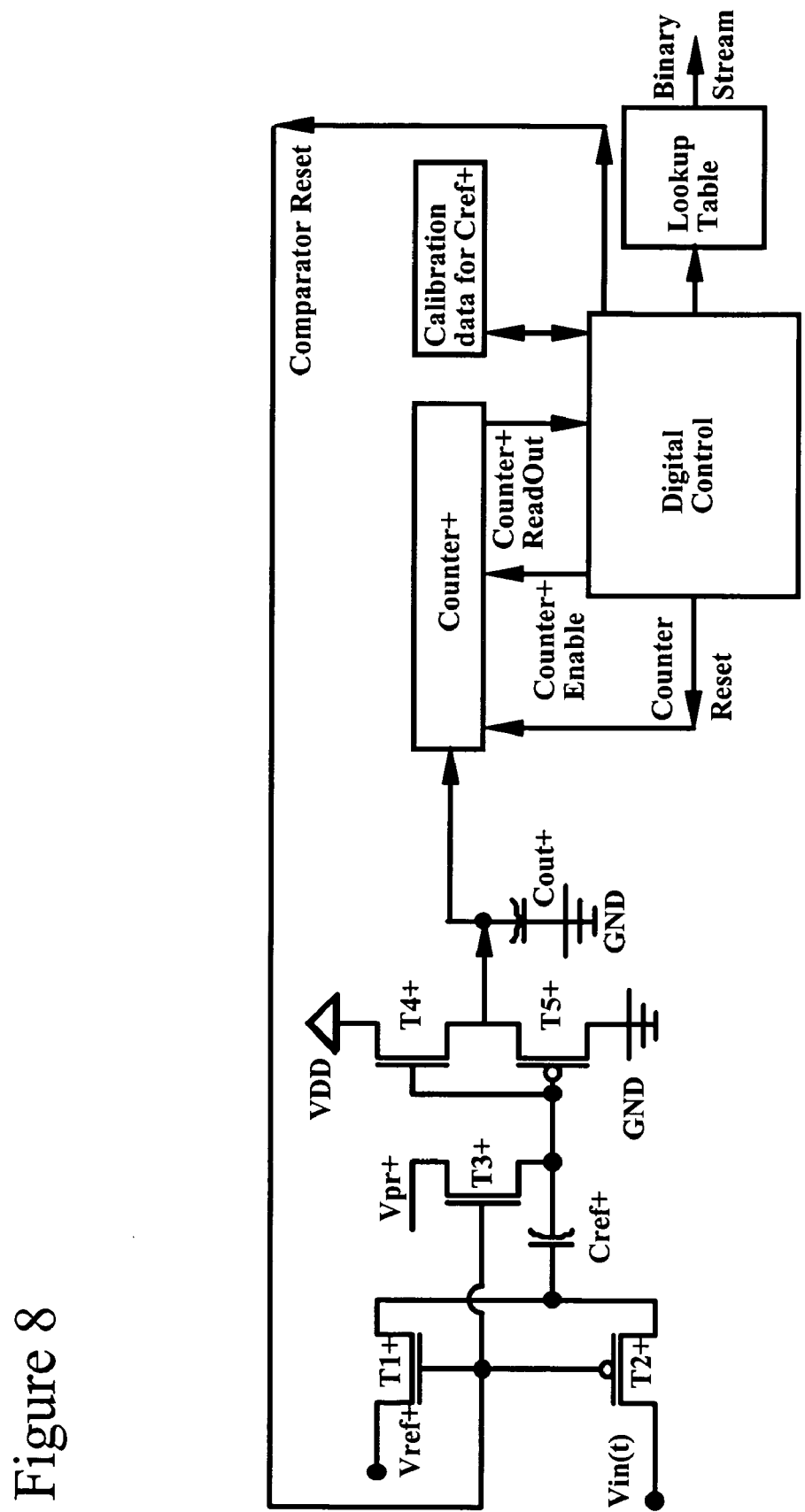
FIG. 8 is a circuit diagram exemplifying a second possible implementation of the present invention for handling input signals of positive polarity only.

FIG. 8 shows a circuit diagram exemplifying a second possible implementation of the present invention for handling input voltage signals of positive polarity only. With this implementation, once the clock stops, the "Control" unit looks up a 3-dimensional table to find which digital value of Vin corresponds to the time given by the clock, for the particular value of Vref used in that conversion. This table has pre-computed values of Vin, according to the formula Vref/{1−Exp[−Tref/(R×Cref)]}, for a range of values of Vref and Tref, and for the constant R×Cref. Depending on the number of entries for Vref and Tref, this table could be very large.

Figure 9:
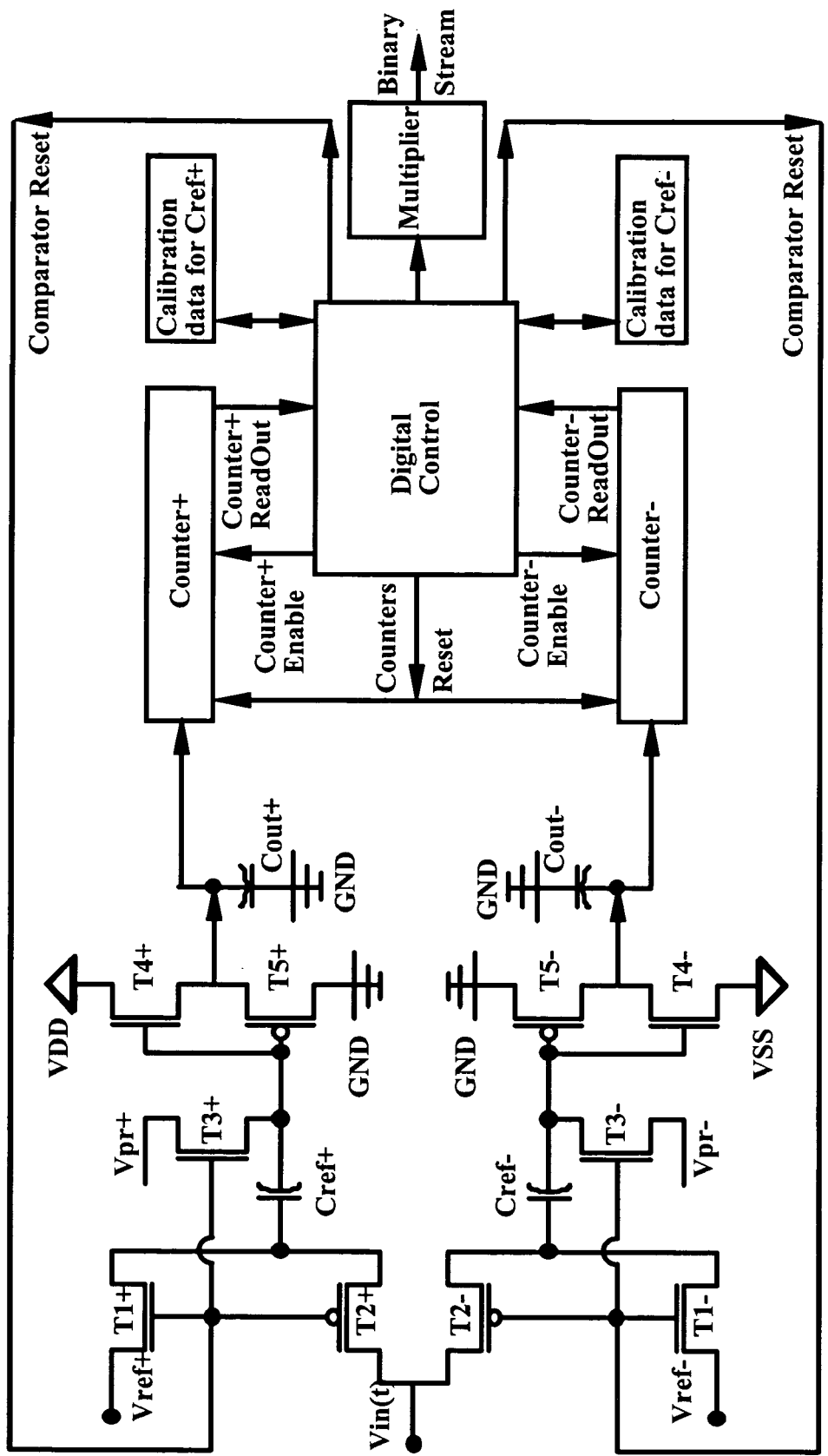
FIG. 9 is a circuit diagram exemplifying a first possible implementation of the present invention for handling input signals of positive and negative polarities.
Figure 10:
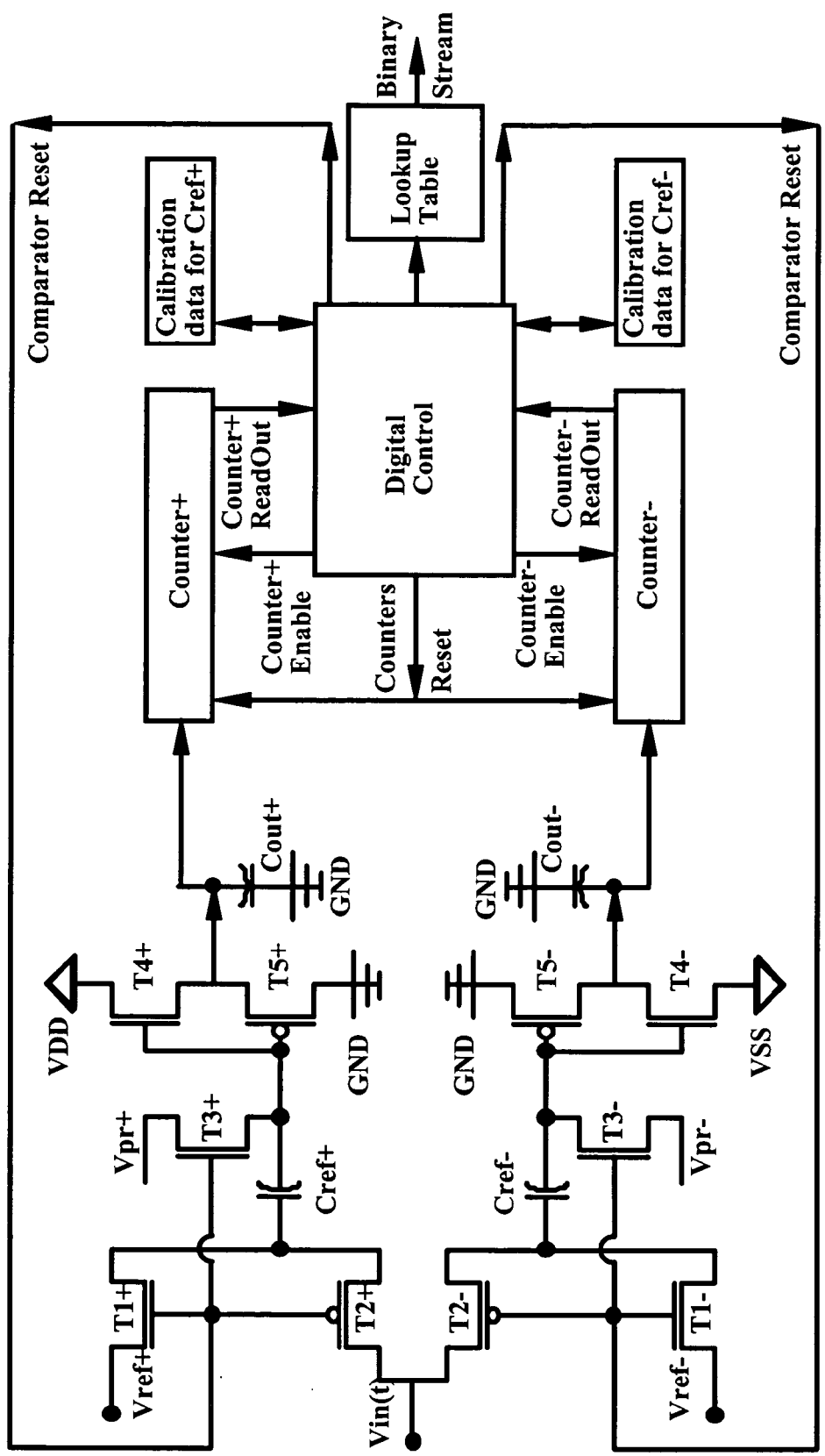
FIG. 10 is a circuit diagram exemplifying a second possible implementation of the present invention for handling input signals of positive and negative polarities.

In FIG. 9 there is shown a circuit diagram exemplifying a first possible implementation of the present invention for handling input voltage signals of positive and negative polarities and in FIG. 10 there is shown a circuit diagram of a second possible implementation of the present invention for handling input voltage signals of positive and negative polarities.

As it can be seen in the drawings, input signals of opposite polarities are processed in identical but separate branches. The branch handling positive input voltages has positive Vref (called Vref+), positive Vpr (called Vpr+) and positive VDD (voltage level of the power supply for NMOS devices). The branch handling negative input voltages has negative Vref (called Vref−), negative Vpr (called Vpr−) and negative VDD (called VSS).

Figure 11:
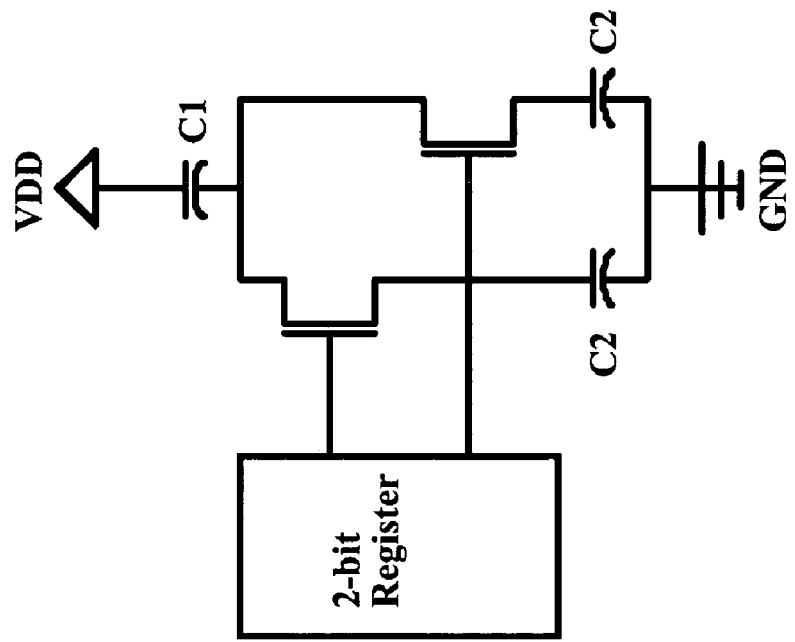
FIG. 11 shows an exemplary circuit for the digital selection of analog positive reference voltages (Vref) for the circuits shown in FIGS. 1, 2, 7 and 8.
Figure 12:
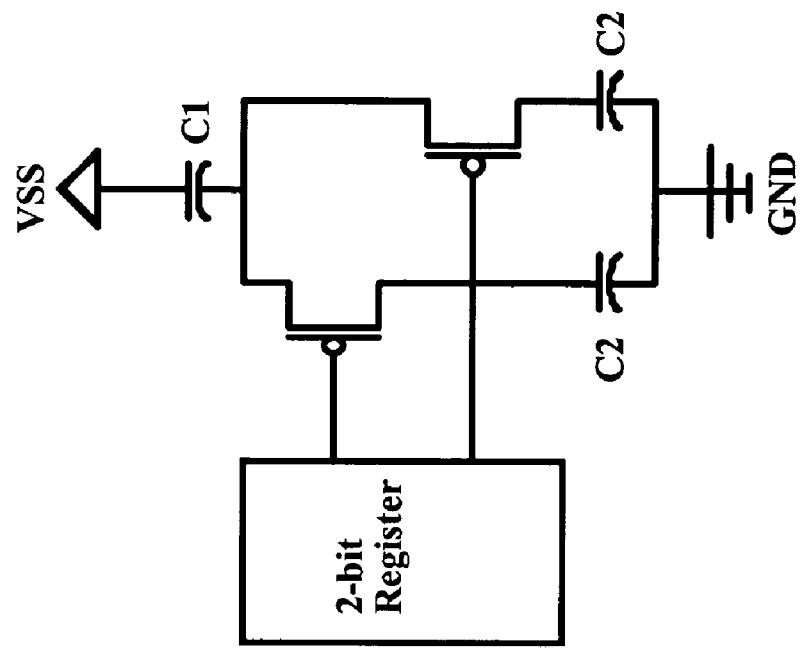
FIG. 12 shows an exemplary circuit for the digital selection of analog negative reference voltages (Vref) for the circuits shown in FIGS. 9 and 10.

In the proposed scheme, the magnitude of Vref (for both positive and negative voltages) can be digitally programmed, that is, selected from a set of predefined voltage values. These can be implemented in a very simple manner. FIG. 11 shows an exemplary circuit implemented with NMOS devices for handling positive voltages. A similar scheme shown in FIG. 12 is implemented with PMOS devices to handle negative voltages.

Even though the analog-to-digital conversion method of the present invention does not predefine or limit the number of bits of the output binary stream, any actual implementation of the method is forced to make choices about the number of bits for the representation of the different parameters, Vref, R×Cref, Tref, resolution of the clock, precision of the hardware multiplier, etc.

The calibration step is achieved by fixing the input voltage to the expected maximum input signal voltage, say 5 volt and using another reference voltage, for example 1 volt, to determine the value of the time constant R×Cref. For any capacitor, this value has to be determined and stored in a register only once. After that procedure the value is available for any subsequent use in calculations.

Another factor to be taken into account is the possible loss of precision due to the inherent digital approximation to the solution of equations (4) in the quantization process of the proposed method. The digital control circuit can choose the operation point, meaning the target values for Vref so that the time it takes to charge the capacitor Cref to reach the voltage Vref is a "good" choice from the viewpoint of having a large enough number of quantization bits.

The conversion rate, which limits the maximum frequency of the input signal possible to quantize, is dependent on, and inversely proportional to, the time interval Tref, i.e., the time necessary for the input signal to match Vref Therefore, the smaller the value of Vref the shorter the time interval Tref during which the counter is running, and therefore the faster the conversion rate. In the limit, the maximum frequency of the input signal possible to track by this conversion method is inversely proportional to the shortest possible time interval, which is the period of oscillation of the clock Tclock. Conversely, the higher the frequency of the clock Tclock, the higher the maximum frequency of the input signal Vin(t) the conversion method can track.

Figure 13:
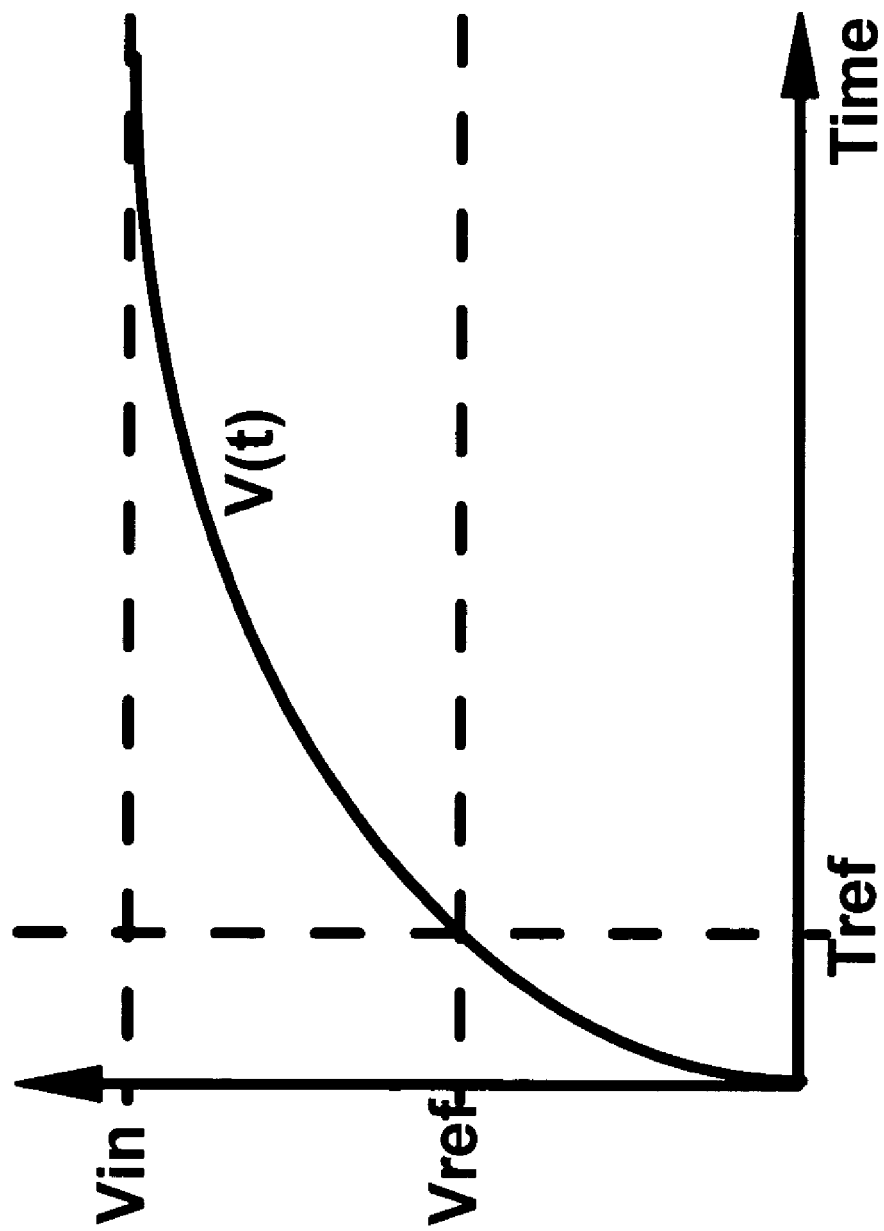
FIG. 13 is a diagram showing the charging up of a capacitor with the definition of the parameters, Vin, Vref R×Cref and Tref

FIG. 13 shows the charging up of a capacitor with the definition of the parameters, Vin, Vref R×Cref and Tref.

On the other hand, larger values of Vref imply longer time intervals Tref for counting, which means more clock cycles for the same value of the input signal Vin(t). The larger the number of clock cycles for a given value of Vin(t), the smaller the extrapolation error.

Figure 14:
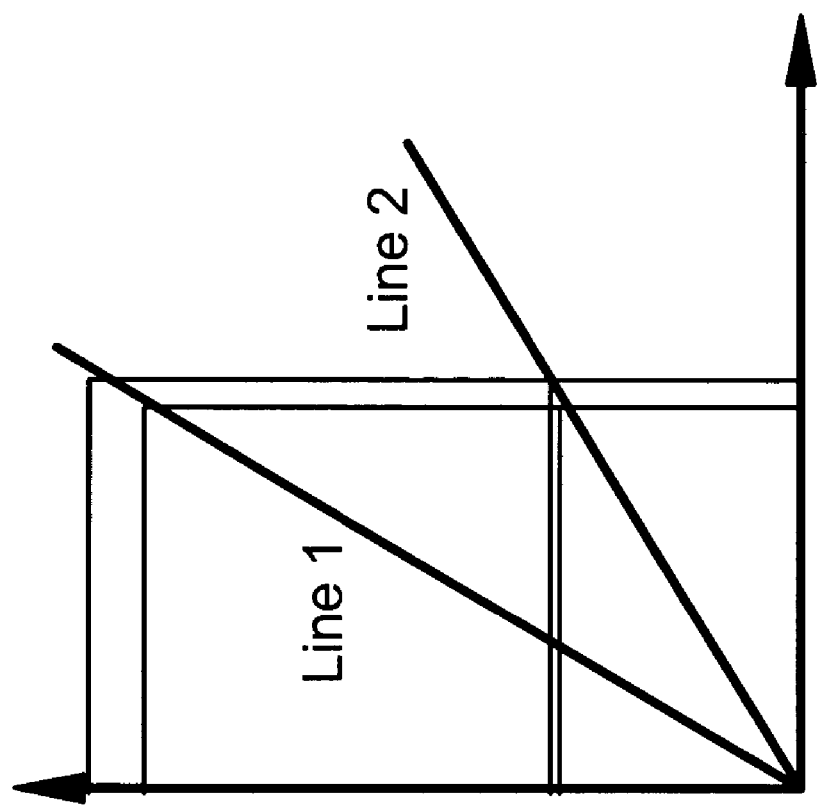
FIG. 14 is an exemplary diagram showing how for straight lines of different slopes, the same variation on the horizontal axis produces very different variations on the vertical axis.

The error being considered here originates from the fact that for a same Vin(t), two different values of Vref produce two different slopes for the analytical curve for V(t), while obviously yielding the same digital value at the counter. However, the larger the slope, the smaller the value of Vref, and the smaller the ratio Tref/Tclock and hence the larger the rounding error in the determination of the exact time interval Tref. This can be understood graphically, as shown in FIG. 14, in the following manner: as the slope of straight line increases, the same absolute fluctuation on the horizontal axis, produces increasingly larger variations on the vertical axis.

Therefore the clock that measures the time-transient across the capacitor should have the highest frequency possible. A very high frequency clock can be made with simple circuit schemes such as "ring oscillators", whose speed is directly related to the intrinsic performance of transistors, which is directly related to the technology generation with which the circuits are fabricated, thereby taking maximum advantage of the relentless progress of IC fabrication technology, also known as "Moore's Law".

The dynamic range (DNR) is determined by, and proportional to, the frequency of the clock (Tclock) of the time counter monitoring the transient charging up of the capacitor Cref. The higher the frequency of the clock, the larger the dynamic range. In other words, the maximum dynamic range possible is inversely proportional to the minimum period of oscillation of the clock (Tclock).

Figure 15:
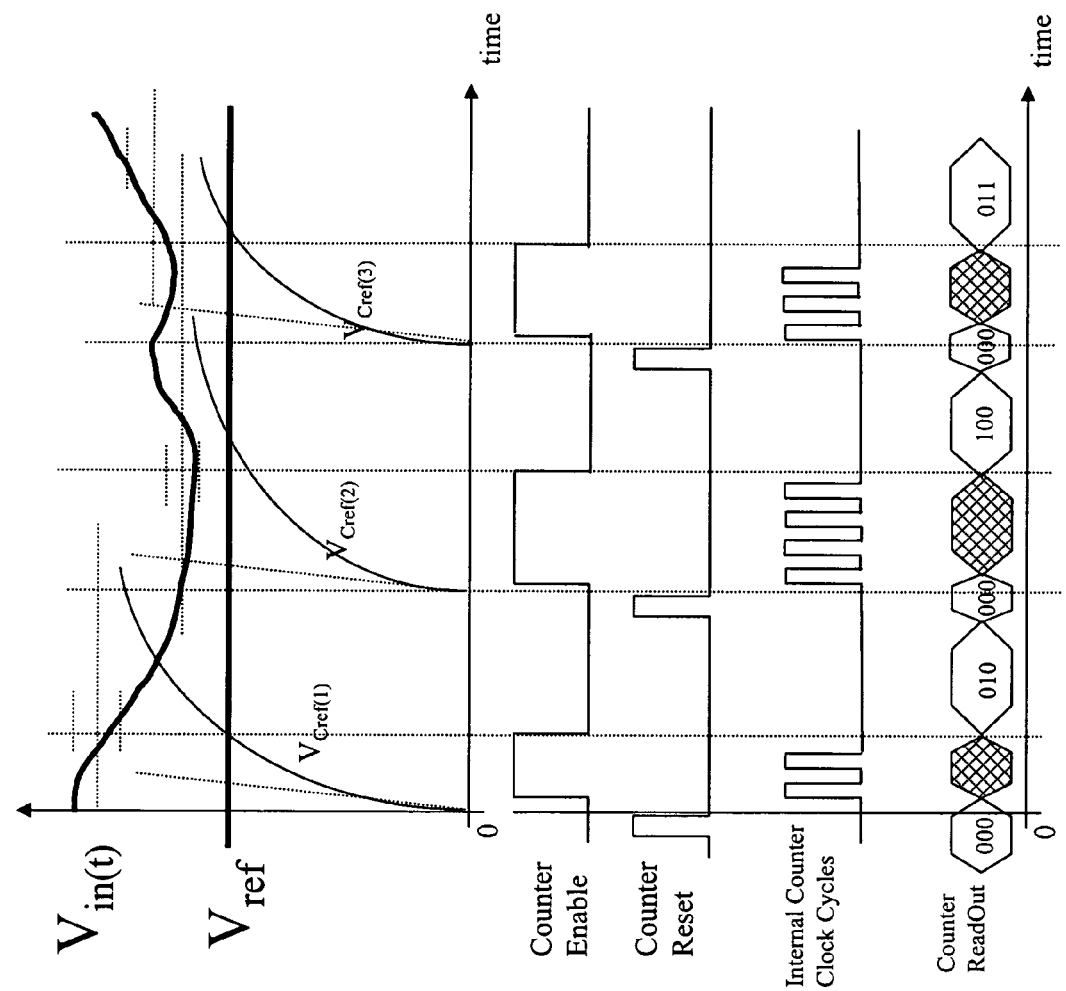
FIG. 15 shows a timing diagram of the circuit shown in FIG. 7.

FIG. 15 shows the timing diagrams of the operation of the circuits of FIGS. 7 and 9.

The Digital Control block included in the circuits shown in FIGS. 7 and 9 performs a sequence of steps in the absence of calibration or adjustments of the reference voltage Vref (see Step 1):

Step 1. The Digital Control block selects the Vref voltage with the suitable amplitude.

Step 2. The Digital Control block commands the capacitor Cref to be charged with Vref, that is to have one terminal exposed to Vpr and the other exposed to Vref.

Step 3. The Digital Control block commands the terminal of Cref that was exposed to Vref to be now exposed to Vin(t), and the other terminal to be disconnected from Vpr. While doing this, the "Digital Control" block looks for a transition at the output of the comparator, which marks the moment in time Tref when voltage V(t) across the capacitor Cref reaches Vref.

Step 4. The Digital Control block commands the resetting of capacitor Cref, that is, one terminal of Cref is again exposed to Vref while the other is connected to Vpr. In the implementation of FIG. 7, the Digital Control block transfers the time registered by the clock to the hardware multiplier so that the value of Vin is calculated. In the implementation of FIG. 9, the Digital Control block looks up in a table the precalculated digital value of Vin for the Vref used and for the time registered by the clock.

The new ADC method of the present invention, is a serial scheme, in which the bandwidth, defined as the product (dynamic-range×conversion-speed), is not predefined in hardware. Controlling the magnitude of Vref, enables the DNR to be increased or decreased, and consequently the conversion speed is decreased or increased, respectively.

Speed of conversion should not be mistaken with "sampling rate", because the input signal is not sampled. The new ADC method of the present invention does not have a predefined sampling rate. A transition at the output of the comparator is used by the digital control unit to calculate the input signal, and possibly also as the trigger to start a new quantization procedure.

With appropriate digital circuitry to monitor the digital value of the input signal, it is possible to dynamically adjust the magnitude of Vref in order to optimize, and adjust in real time, the total bandwidth available as a function of the evolution of the input signal.

If there are no transitions at the output of the comparator, that could be an indication that the value of Vref is too large, and that a new quantization process with a smaller Vref should be tried. If there are no transitions even when Vref is set at its minimum value, which is dependent on the noise level, then the clock counting time is not stopped, and Cref remains exposed to the input signal (Vin) until Vin becomes larger then Vref. Therefore it can be said that the operation is asynchronous.

The new ADC method of the present invention requires only digital components, such as transistors and capacitors, and does not require other devices or circuits, such as DACs. Thus, it can be made extremely compact and the design can be quickly ported and scaled for any generation of CMOS process technology. It should be emphasized that the new ADC scheme is such that it can take maximum advantage of the constant improvements of CMOS technology (Moore's Law), and consequently the total bandwidth of the ADC improves with each new CMOS generation.

For a given bandwidth, the proposed ADC method is ultimately limited by intrinsic transistor performance of the CMOS technology used, can be controlled to dynamically trade conversion speed against dynamic range (number of quantization bits). This dynamic control allows for real-time adjustment to the conditions of observation, thus providing an extra degree of freedom for optimization.

For a CMOS implementation of this ADC method, the absence of clock-driven circuitry and, if the input signal is constant, the fact that no transitions take place in the voltage levels of the transistors, result in the power dissipation to be minimal. This intrinsic property is of extreme importance for power-sensitive applications, such as all battery-operated products.

Power dissipation is almost entirely channeled to heat generation, which leads to increased temperature. Considering that thermal noise is a limiting factor to the signal-to-noise ratio (SNR) of many applications, the minimization of power dissipation can also lead to a significant reduction in the generation of thermal noise, and thus to increased SNR.

ADC Methodology with Combination of Schemes for Charge & Voltage Signals

The schemes used to implement the ADC methodology for voltage and charge signals can be combined in a single ADC scheme. The circuit shown in FIG. 16 targets the quantization of complex input voltage signals, such as the multitude of radiofrequency signals that are captured by the antenna of a cellular phone, for example. Typically there are signals of lower frequency with large amplitude, such as those from FM radio stations, and signals of higher frequency and smaller amplitude, such as those of cellular telephony. The frequencies of the second and third generations of digital cellular telephony are in the GHz range, at while the frequency of FM radio is in the range of 100 MHz.

Conventional ADC methods are unsuccessful at dealing with such complex signals in the range of frequencies used by cellular telephones. A drawback of voltage-to-frequency methods is that in the presence of a large constant signal ("DC component"), a significant portion of the bandwidth of the ADC is "wasted" for the "DC component", thereby reducing the bandwidth available to quantize the fast varying component ("AC component") of the input signal. The circuit of FIG. 16 is highly suitable to perform the analog-to-digital conversion of signals captured by the antennas of cellular telephones, and for that reason, it is highly useful for the realization of a "Software-Defined Radio".

The present invention is especially well suited for "always-on" scenarios, in which the detection of very weak differential signals is necessary, even if in the presence of powerful background sources, for as long as the background can be classified as quasi-stationary (for example whose frequency is about 10 times lower) compared to the signals of interest.

Figure 16:
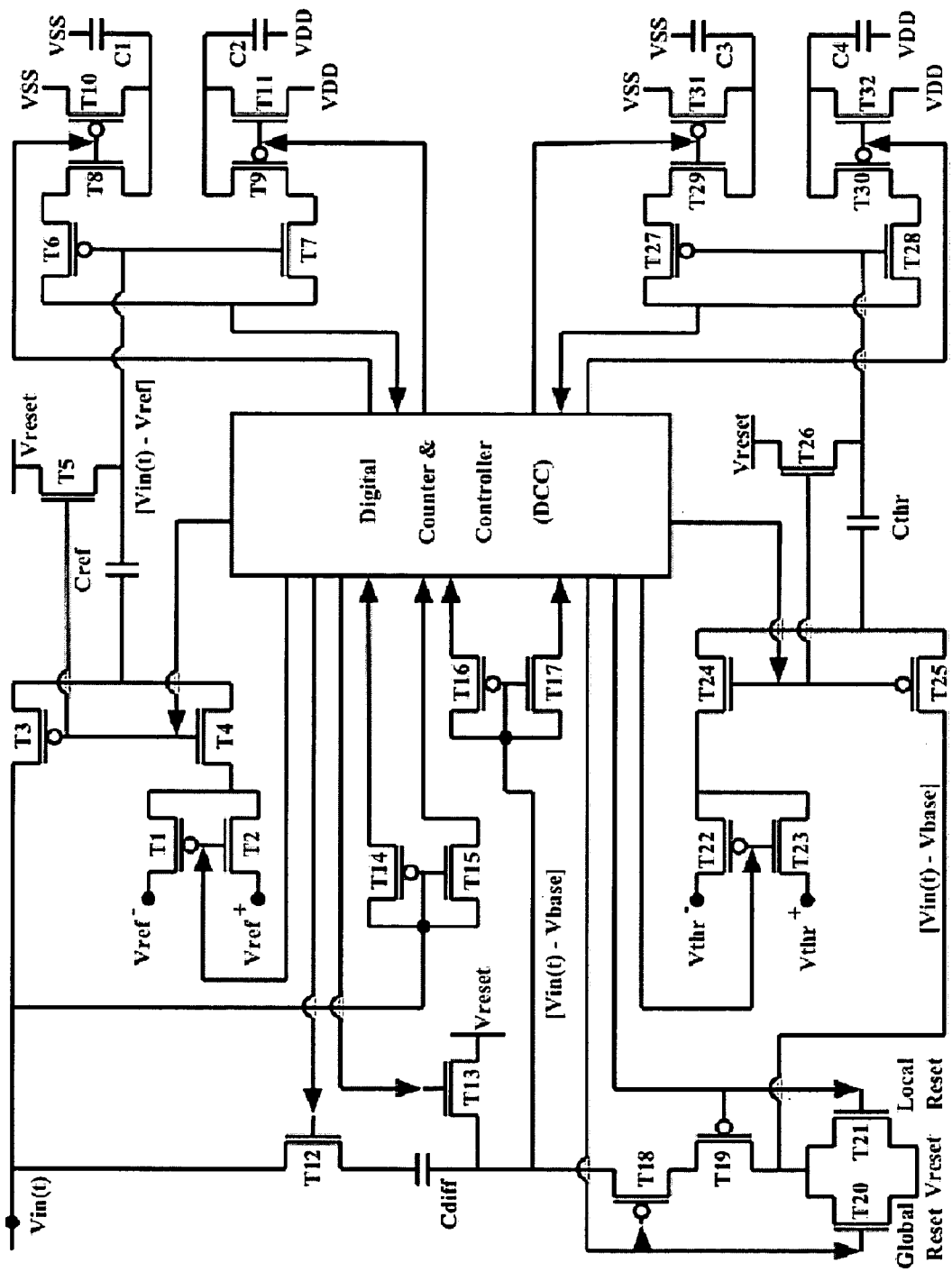
FIG. 16 shows a circuit providing the quantization of complex input voltage signals, such as the multitude of radiofrequency signals that are captured by the antenna of a cellular phone, for example.

In the circuit diagrammatically shown in FIG. 16, the top half forms a "first branch" of the ADC operating in the "Voltage-to-Time Mode" and deals with voltages of larger amplitude and lower frequency. The bottom half of the circuit diagram forms a "second branch" of the ADC operating in the "Charge-to-Frequency Mode" and deals with charge signals (small packets of charge).

The two branches of the circuit implement two different schemes for the conversion of analog input signals into two separate serial digital binary streams, which are then combined into a single serial digital binary stream, in a purely digital and programmable fashion. These two branches operate independently and simultaneously on the input signal: the first one operates on the full amplitude of the input signal Vin(t) while the second one operates on the differential signal [Vin(t)−Vbase]. In this expression, Vbase is defined as Vin(t) when t=t0.

The "brain" of the ADC of the invention is the block called "Digital Counter & Control", abbreviated as DCC. This block is not detailed in the circuit diagram because it just provides the functionalities required for the operation of the ADC proper. This is a fully digital circuit block that receives information from certain devices in the ADC and provides control to other devices in the ADC. The Digital Counter & Controller (DCC) synchronizes the moment when the first branch starts operating on Vin(t) with the moment when the value of Vbase is fixed, which is the same moment when the differential [Vin(t)−Vbase] becomes available to the second branch Quite commonly the signal of interest for a given application or functionality coexists with many other signals which may be of very different amplitude and frequencies. It is very common that the signal of interest if masked by lower frequency signals with much larger amplitudes. These lower frequency signals can be thought of being quasi-stationary compared to the signal of interest Therefore, those signals can be treated as if they were a "DC component" of the overall signal, while the signal of interest can be thought of as the "AC component" of the overall signal. With the combination of the extrapolation method and the direct conversion scheme, any large "DC component" that may exist in the input signal, is digitized once (as Vbase), in the first branch through the extrapolation scheme. The second branch of the ADC is only presented with relative changes to that value. Therefore, the entirety of the bandwidth of the second branch of the ADC is made available to just the changes referenced to Vbase, and will not be used to quantize a large "DC component".

The extrapolation scheme is only performed if the time evolution input signal Vin(t) requires it. Since the "charge-to-frequency" conversion scheme operates on the time evolution of the differential signal [Vin(t)−Vbase], and since it is an asynchronous process, the control command to perform a new conversion by the extrapolation method can also be asynchronously dependent on the results of the direct conversion. Therefore, after a power up and initialization procedure, or after a "Global Reset" it can be said that the entire ADC operates asynchronously.

The block formed by transistors T14/T15 and the block formed by transistors T16/T17 are identical and have the sole purpose of proving the DCC with information regarding the polarity of the signal that they are attached to. T14/T15 provide the information about the polarity of the input signal Vin(t). T16/T17 provide the information about the polarity of the differential signal [Vin(t)−Vbase].

The block formed by transistors T1/T2 and the block formed by transistors T22/T23 serve identical purposes: proving the comparators in each branch with voltage levels that have the same polarity of the signal at the symmetric terminal of the same comparator. The DCC supplies the information regarding which reference polarity is required (meaning which transistors are ON or OFF).

In the first branch of the ADC, transistors T8, T9, T10, T11, capacitors C1 and C2 provide a compensation for the threshold voltage of transistors T6 & T7, and are a conventional arrangement for comparators. The very same functionality is provided by T29, T30, T31, T32, C3 & C4 for the comparator of the second branch of the ADC.

The input signal is routed simultaneously in parallel to three blocks of the circuit:

1) The block formed by T14/T15.

T14/T15 provide the polarity of the raw input signal, Vin(t) to the DCC. Based on this information the DCC sends a control signal to T1/T2 to set the Vref to the same polarity of the Vin(t).

2) The block formed by T3/T4 & T5.

T3/T4 are the first devices inside a comparator, controlling what signals and in what sequence have access to the capacitor Cref. T5 provides a reset voltage level Vreset to Cref.

3) The block formed by T12&T13.

T12&T13 have their gates controlled by the DCC, in synchronicity with the gates of T3/T4 & T5.

T13 provides a reset voltage level Vreset to Cdiff.

Sequence of Steps for the Initialization Procedure

Throughout this section, the following abbreviations will be used:

VDD is the voltage level of the power supply for NMOS devices.

VSS is the voltage level of the power supply of PMOS devices.

VDD=−VSS. For example for a 0.18 µm technology, typically the VDD=1.8 Volts.

Vreset is the voltage for resetting the devices that it is attached to. In this circuit it is zero volts or ground voltage.

The moment t=t0 is when the circuit is undergoing an initialization procedure due to "Power Up" or "Global Reset".

Vin(t) is the time-variable input signal.

Vbase ("Base Voltage") is the input signal at the moment of t=t0, i.e., Vbase=Vin(t=t0).

Cref is the capacitor inside the comparator working in the "Voltage-to-Time Mode".

Vref+ is the positive reference voltage for the "Voltage-to-Time Mode".

Vref−, is the negative reference voltage for the "Voltage-to-Time Mode".

Cthr is the capacitor inside the comparator working in the "Charge-to-Frequency Mode".

Vthr+ is the positive threshold voltage for the "Charge-to-Frequency Mode".

Vthr− is the negative threshold voltage for the "Charge-to-Frequency Mode".

Cdiff is the capacitor that provides the differential signal for the second branch to operate.

The DCC acquires the information about the polarity of Vin(t) and signals to T1/T2 which one is to be ON, i.e. it signals the polarity of Vref that will be provided to T4.

Time=t0

T4 & T5 are ON, T3 is OFF.
Cref is charged with the Vref (of the suitable polarity).
T12 & T13 are ON
Cdiff has one terminal connected to Vreset, while the other is exposed to the instantaneous signal Vin(t).

Time=t1

T3 turns ON, T4 & T5 turn OFF.
Cref is now exposed to Vin(t), and therefore [Vin(t)–Vref] is applied to the gates of T6/T7. The output of T6/T7 is monitored by the DCC.
T12 remains ON, T13 is turned OFF.
The value of Vin(t) immediately before T13 is switched OFF (t=t0)), becomes Vbase.
From now on (i.e., T>t1), the voltage across Cdiff is [Vin(t)–Vin(t=t0)], which according to the definition of Vbase given above, is the same as [Vin(t)–Vbase].
For as long as T12 remains ON, [Vin(t)–Vbase] continues to change continuously reflecting the changes to Vin(t) in real time.
T18 & T21 are OFF, T19 & T20 are ON, T25 is at Vreset.
The information about the polarity of [Vin(t)–Vbase] is provided to the in real time DCC by the block of T16/T17. With this information the DCC sends a control signal to T22/T23 in order to provide T24 with Vthr of the same polarity as [Vin(t)–Vbase].
T24 & T26 are ON, T25 is OFF.
Cthr is charged with Vthr (of the same polarity as [Vin(t)–Vbase]).

Time=t2

T18 & T19 turn ON, T20 & T21 are OFF, T24 & T26 turn OFF, T25 turns ON.
When [Vin(t)–Vbase] reaches the value of Vthr that Cthr was pre-charged with, the output of T27 & T28 will show a ripple that is read by the DCC.

Time=t3

The moment that a ripple shows a the output of T27 & T28, the DCC immediately sends a control signal for "Local Reset":
T19 turns OFF (T18 remains ON), T21 turns ON (T20 remains OFF), T24 & T26 turn ON, T25 turns OFF.
Therefore Cthr is pre-charged again with Vthr of the suitable polarity (which may or may not have changed).
A new cycle of the steps described under T=t2 and T=t3 can start again.

If the value of the differential signal [Vin(t)–Vbase] does not reach the value of Vthr, then the capacitor Cref will remain pre-charged with Vthr, and there is not ripple at the output of T27/T28. Therefore this branch of the ADC remains in this state until the moment that [Vin(t)–Vbase] matches or exceeds Vthr.

Figure 17:
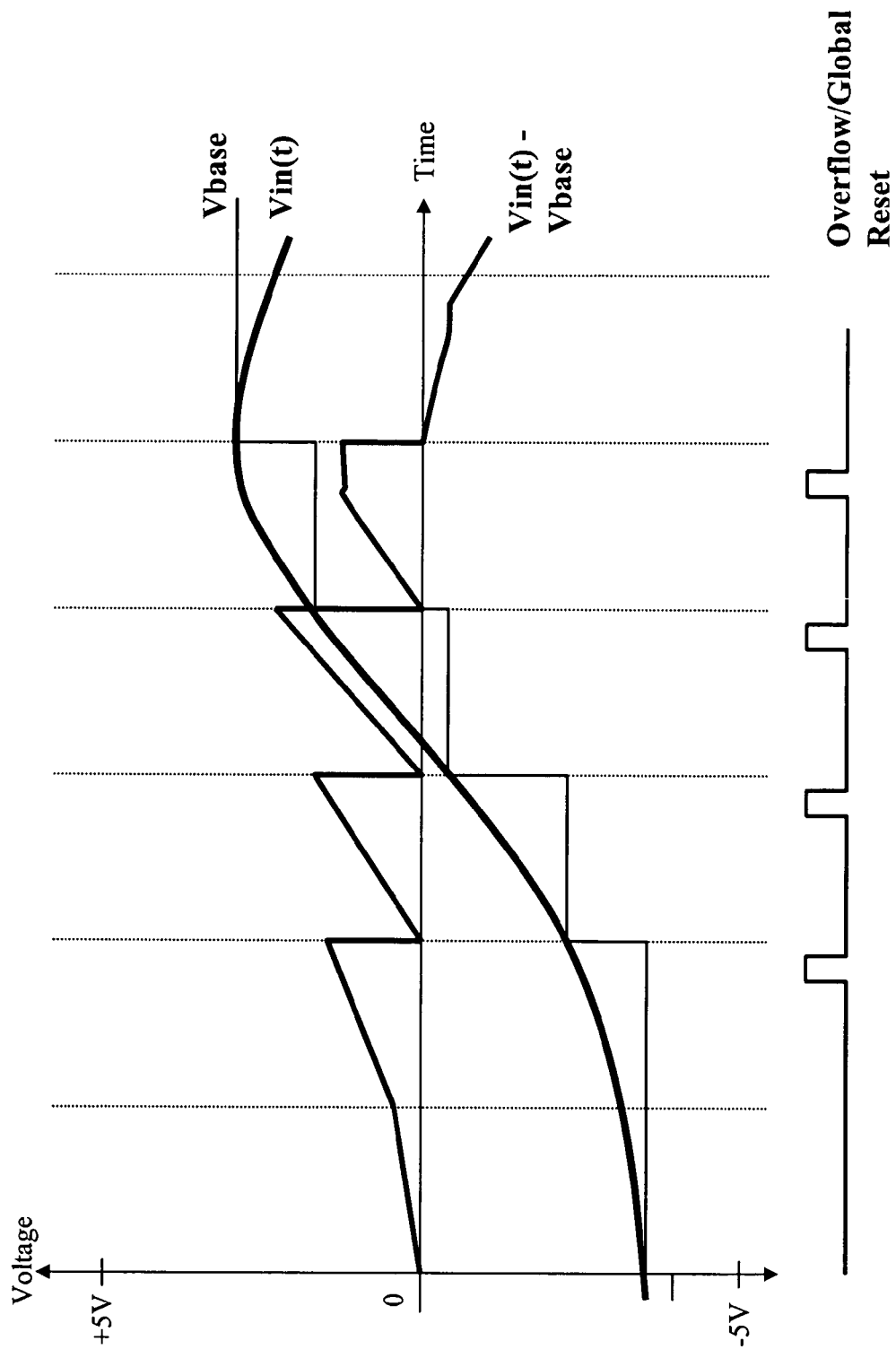
FIG. 17 shows one timing diagram of the circuit shown in FIG. 16.
Figure 18:
FIG. 18 shows another timing diagram of the circuit shown in FIG. 16.

FIGS. 17 and 18 show timing diagrams of the mode of operation of the implementation of FIG. 16.

If the dynamic range of the differential signal [Vin(t)–Vbase] is too large, the output of T27/T28 toggles at the maximum speed allowed by the intrinsic performance of the transistors, leading to a counter overflow. This can be solved or avoided, by increasing the amplitude of Vthr+ and Vthr−, that is, by increasing the quantization step, and consequently increasing also the quantization error.

If the dynamic range of the differential signal [Vin(t)–Vbase] becomes too large even when Vthr is set to its maximum possible value, then there will be a "Global Reset" process, during which the acquisition of a new value for Vbase takes place. The sequence of steps is identical to that of the "Initialization Procedure" described above.

The invention claimed is:

1. A method of converting analog electric signals into a stream of binary data, comprising the steps of:
    (a) Applying to a capacitor a reference voltage corresponding to a predetermined threshold value,
    (b) Switching said capacitor to have applied to it an analog input signal directly, without performing "sample and hold" of said input signal,
    (c) Generating a transition pulse when the analog input signal reaches said predetermined threshold value, without circuit switching at the input or the output until that moment,
    (d) Subtracting from the input signal the fraction thereof that corresponds to said predetermined threshold value,
    (e) Upon the occurrence of said transition pulse, simultaneously perform:
        passive digital monitoring of the occurrence of said transition pulse, and
        asynchronously reset said capacitor and start a new switching cycle,
    (f) Digitally process transition pulses to generate a digital data stream corresponding to the digital value of the analog input signal.

2. The method of claim 1, wherein the analog input signal consists of a finite amount of charge stored in a charge reservoir.

3. A method of converting analog electric signals into a stream of binary data, comprising the steps of:
    (a) Applying to a capacitor a reference voltage corresponding to a predetermined threshold value,
    (b) Switching said capacitor to have applied to it an analog input signal directly, without performing "sample and hold" of said input signal,
    (c) Generating a transition pulse when the analog input signal reaches said predetermined threshold value, without circuit switching at the input or the output until that moment,
    (d) Upon the occurrence of said transition pulse, simultaneously perform:
        passive digital monitoring of the occurrence of said transition pulse, and
        asynchronously reset said capacitor and start a new switching cycle,
    (e) Digitally process transition pulses to generate a digital data stream corresponding to the digital value of the analog input signal.

4. The method of claim 3, wherein the input signal applied to the capacitor consists of a voltage signal and wherein the reference voltage is derived from the time-varying analog input signal itself.

5. An analog to digital converter comprising a capacitor having a first terminal connected to an analog input signal and a second terminal connected to a reference voltage corresponding to a predetermined threshold value,
    switching means to alternately switching the first terminal of said capacitor to the analog input signal for being charged and to a discharging terminal,
    digital means for generating a transition pulse when the analog input signal reaches said predetermined threshold value, digital control means to monitor the occurrence of each transition pulse and command said switching means, and counting means to generate a digital data stream corresponding to the digital value of the analog input signal.

6. An analog to digital converter comprising a capacitor having a first terminal connected an analog input signal and a second terminal, means having an input connected to the analog input signal and an output connected to said second terminal of the capacitor, said means being arranged to determine successive reference voltages as a function of time, said reference voltages corresponding each to a predetermined threshold value, digital means for generating a transition pulse when the analog input signal reaches said predetermined threshold value, digital control means to monitor the occurrence of each transition pulse and command resetting of the capacitor, and counting means to generate a digital data stream corresponding to the digital value of the analog input signal.

* * * * *